US012740172B2

(12) United States Patent
Okawa

(10) Patent No.: US 12,740,172 B2
(45) Date of Patent: Sep. 15, 2026

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Tatsuya Okawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 817 days.

(21) Appl. No.: 18/000,650

(22) PCT Filed: Apr. 23, 2021

(86) PCT No.: PCT/JP2021/016411
§ 371 (c)(1),
(2) Date: Dec. 2, 2022

(87) PCT Pub. No.: WO2021/256086
PCT Pub. Date: Dec. 23, 2021

(65) Prior Publication Data

US 2023/0230992 A1 Jul. 20, 2023

(30) Foreign Application Priority Data

Jun. 16, 2020 (JP) ................................ 2020-103691

(51) Int. Cl.
*H10F 39/00* (2025.01)
*H04N 23/00* (2023.01)
(Continued)

(52) U.S. Cl.
CPC ......... *H10F 39/8067* (2025.01); *H04N 23/00* (2023.01); *H10F 39/024* (2025.01);
(Continued)

(58) Field of Classification Search
CPC .... H10F 39/191; H10F 39/192; H10F 39/193; H10F 39/199; H10F 39/80; H10F 39/806;
(Continued)

(56) References Cited

U.S. PATENT DOCUMENTS

2017/0345853 A1 11/2017 Kato et al.
2018/0047768 A1 2/2018 Suzuki et al.
(Continued)

FOREIGN PATENT DOCUMENTS

JP 2017-212351 11/2017
JP 2018-029170 2/2018
(Continued)

OTHER PUBLICATIONS

International Search Report and Written Opinion prepared by the Japan Patent Office on Jul. 13, 2021, for International Application No. PCT/JP2021/016411, 2 pgs.

*Primary Examiner* — Monica D Harrison
*Assistant Examiner* — John Lin
(74) *Attorney, Agent, or Firm* — SHERIDAN ROSS P.C.

(57) ABSTRACT

Color mixing between pixels of different colors is suppressed. A solid-state imaging device includes: a semiconductor layer including a plurality of photoelectric conversion sections partitioned by an isolation region; a shared on-chip lens arranged on a light incident surface side of the semiconductor layer, the shared on-chip lens being shared by the photoelectric conversion sections adjacent to each other with the isolation region interposed between the photoelectric conversion sections, and having a condensing point positioned in the isolation region; and a concave portion provided in an upper portion of the photoelectric conversion sections that share the shared on-chip lens on the light incident surface of the semiconductor layer.

8 Claims, 20 Drawing Sheets

(51) Int. Cl.
*H10F 39/12* (2025.01)
*H10F 39/18* (2025.01)

(52) U.S. Cl.
CPC ....... *H10F 39/182* (2025.01); *H10F 39/8053* (2025.01); *H10F 39/8063* (2025.01); *H10F 39/807* (2025.01)

(58) Field of Classification Search
CPC . H10F 39/8063; H10F 39/8067; H10F 39/807
See application file for complete search history.

(56) References Cited

U.S. PATENT DOCUMENTS

2019/0096930 A1* 3/2019 Chuang ................. H10F 39/807
2020/0235149 A1 7/2020 Shiraishi et al.

FOREIGN PATENT DOCUMENTS

JP 2018201015 * 12/2018 ............. H10F 39/12
WO WO 2016/098640 6/2016
WO WO 2018/042785 3/2018

* cited by examiner

SOLID-STATE IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2021/016411, having an international filing date of 23 Apr. 2021, which designated the United States, which PCT application claimed the benefit of Japanese Patent Application No. 2020-103691, filed 16 Jun. 2020, the entire disclosures of each of which are incorporated herein by reference.

TECHNICAL FIELD

The present technology (technology according to the present disclosure) relates to a solid-state imaging device and an electronic device, and particularly relates to a technology effectively applied to a solid-state imaging device and an electronic device including a shared on-chip lens shared by a plurality of photoelectric conversion sections.

BACKGROUND ART

A solid-state imaging device includes a semiconductor layer including a plurality of photoelectric conversion sections partitioned by an isolation region, and a color filter layer and an on-chip lens arranged on a light incident surface side of the semiconductor layer. Patent Document 1 discloses a pixel unit in which one shared on-chip lens is shared by two photoelectric conversion sections arranged adjacent to each other in one direction in 2×1 array. Furthermore, a pixel unit is also disclosed in which one shared on-chip lens is shared by four photoelectric conversion sections arranged in 2×2 array in both an X direction and a Y direction orthogonal to each other in a plan view.

CITATION LIST

Patent Document

Patent Document 1: WO 2016/098640 A

SUMMARY OF THE INVENTION

Problems to be Solved by the Invention

By the way, in a pixel unit in which one shared on-chip lens is shared by four photoelectric conversion sections in 2×2 array, a condensing point of a shared on-chip lens is positioned at an intersection portion between an isolation region extending in the X direction and an isolation region extending in the Y direction. Therefore, incident light condensed at the condensing point of the shared on-chip lens is scattered due to a refractive index difference between a silicon layer (n=3.9) of the photoelectric conversion section and a silicon oxide film (n=1.4) of the isolation region. Additionally, there is a possibility that the scattered light enters the isolation region on a side opposite to the isolation region of the condensing point at an angle equal to or larger than the critical angle, and enters the photoelectric conversion section of an adjacent pixel as unnecessary light. In a case where unnecessary light enters the adjacent photoelectric conversion section, it becomes a factor that causes color mixing between pixels of different colors, and thus there has been room for improvement from the viewpoint of definition and resolution.

An object of the present technology is to provide a solid-state imaging device and an electronic device that can suppress color mixing between pixels of different colors.

Solutions to Problems

A solid-state imaging device according to an aspect of the present technology includes:

- a semiconductor layer including a plurality of photoelectric conversion sections partitioned by an isolation region;
- a shared on-chip lens that is shared by the above-described photoelectric conversion sections adjacent to each other with the above-described isolation region interposed between the photoelectric conversion sections, the shared on-chip lens being provided on a light incident surface side of the above-described semiconductor layer so as to have a condensing point positioned in the above-described isolation region; and
- a light reflector provided in the above-described photoelectric conversion sections that share the shared on-chip lens, the light reflector causing light condensed at the above-described condensing point and scattered in the above-described isolation region to be reflected toward a side opposite to the above-described light incident surface of the above-described semiconductor layer.

An electronic device according to another aspect of the present technology includes:

- a solid-state imaging device;
- an optical lens that forms an image of image light from a subject on an imaging surface of the above-described solid-state imaging device; and
- a signal processing circuit that performs signal processing on a signal output from the above-described solid-state imaging device.

Additionally, the above-described solid-state imaging device includes:

- a semiconductor layer including a plurality of photoelectric conversion sections partitioned by an isolation region;
- a shared on-chip lens that is shared by the above-described photoelectric conversion sections adjacent to each other with the above-described isolation region interposed between the photoelectric conversion sections, the shared on-chip lens being provided on a light incident surface side of the above-described semiconductor layer so as to have a condensing point positioned in the above-described isolation region; and
- a light reflector provided in the above-described photoelectric conversion sections that share the shared on-chip lens, the light reflector causing light condensed at the above-described condensing point and scattered in the above-described isolation region to be reflected toward a side opposite to the above-described light incident surface of the above-described semiconductor layer.

BRIEF DESCRIPTION OF DRAWINGS

FIG. 1 is a chip layout diagram illustrating a configuration example of a solid-state imaging device according to a first embodiment of the present technology.

FIG. 3C is a schematic plan view in which FIG. 3B is simplified.

MODE FOR CARRYING OUT THE INVENTION

Figure 2:
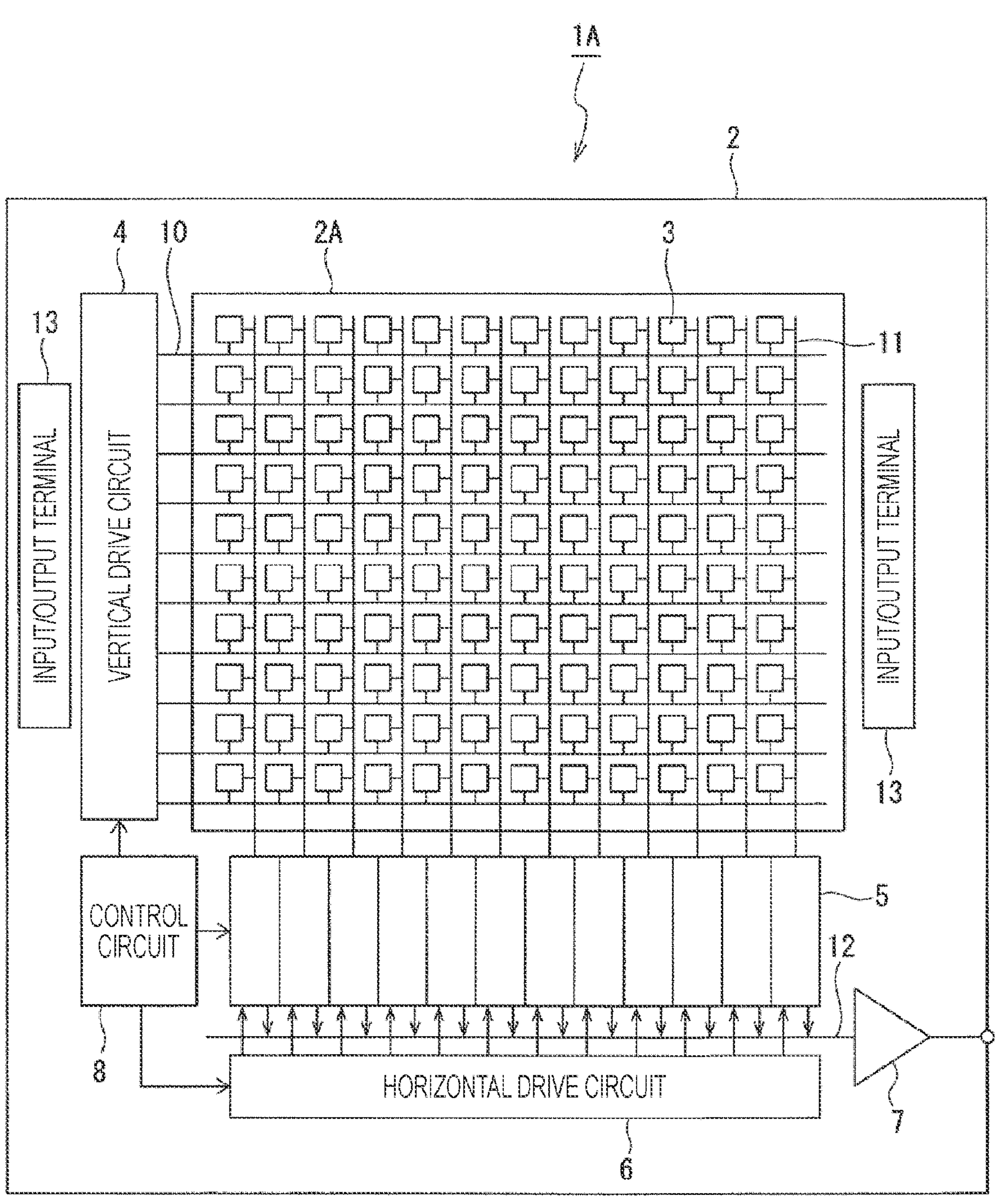
FIG. 2 is a block diagram illustrating a configuration example of the solid-state imaging device according to the first embodiment of the present technology.

Hereinafter, embodiments of the present technology will be described in detail with reference to the drawings.

Note that, in all the drawings for describing the embodiments of the present technology, components having the same functions are denoted by the same reference numerals, and repeated description thereof will be omitted.

Furthermore, each drawing is schematic and there is a case where the drawing is different from an actual one. Furthermore, the following embodiments illustrate examples of a device and a method for embodying the technical idea of the present technology, and do not limit the configuration to that described below. That is, the technical idea of the present technology can be variously modified within the technical scope described in the claims.

Furthermore, in the following embodiments, in three directions orthogonal to each other in a space, a first direction and a second direction orthogonal to each other in the same plane are defined as an X direction and a Y direction, respectively, and a third direction orthogonal to both the first direction and the second direction is defined as a Z direction. Additionally, in the following embodiments, description will be made with a thickness direction of a semiconductor layer 20 described later defined as the Z direction.

First Embodiment

In a first embodiment, an example will be described in which the present technology is applied to a solid-state imaging device that is a back-illuminated complementary metal oxide semiconductor (CMOS) image sensor.

<<Overall Configuration of Solid-State Imaging Device>>

First, a planar layout of a solid-state imaging device 1 will be described.

Figure 1:
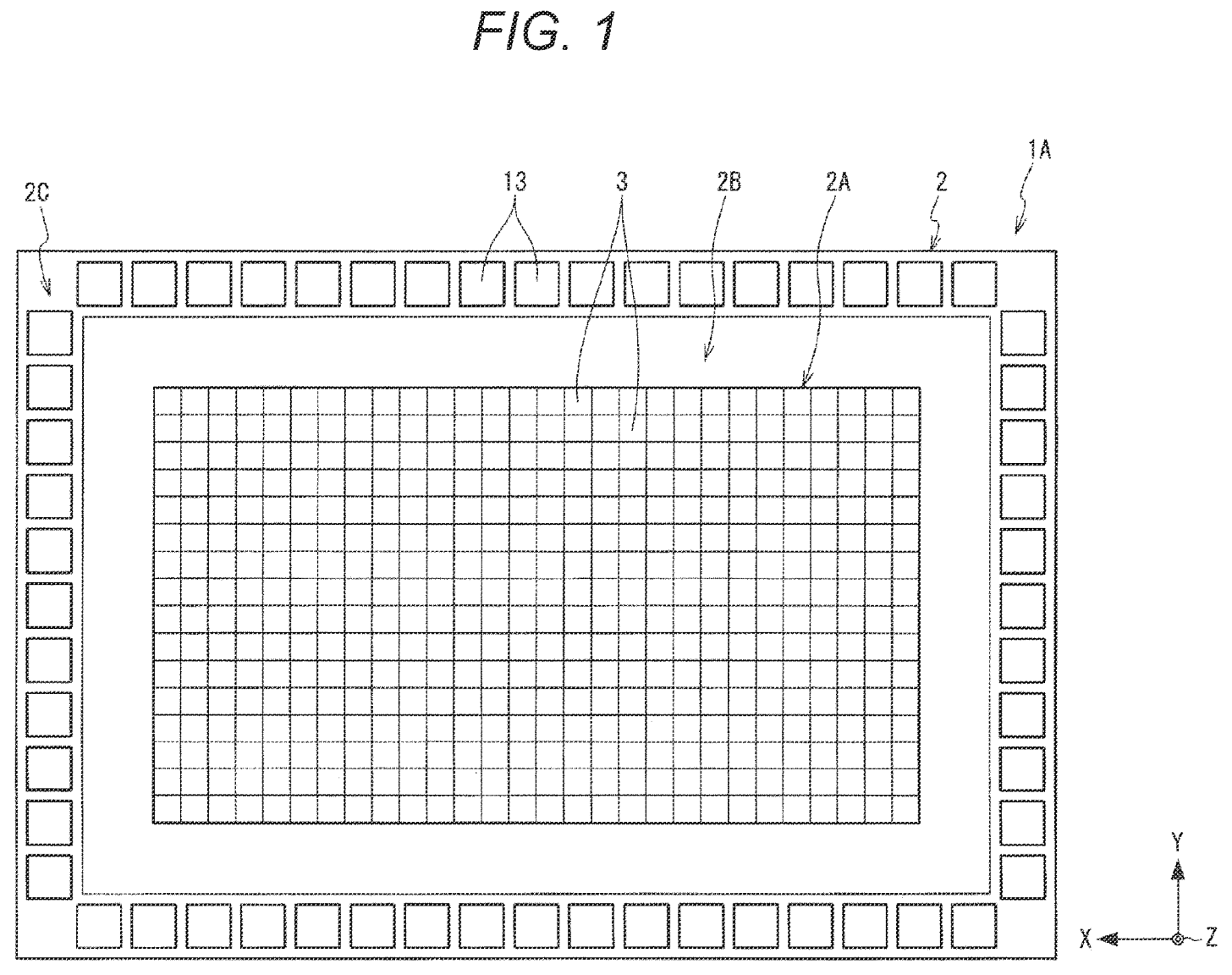
Figure 11:
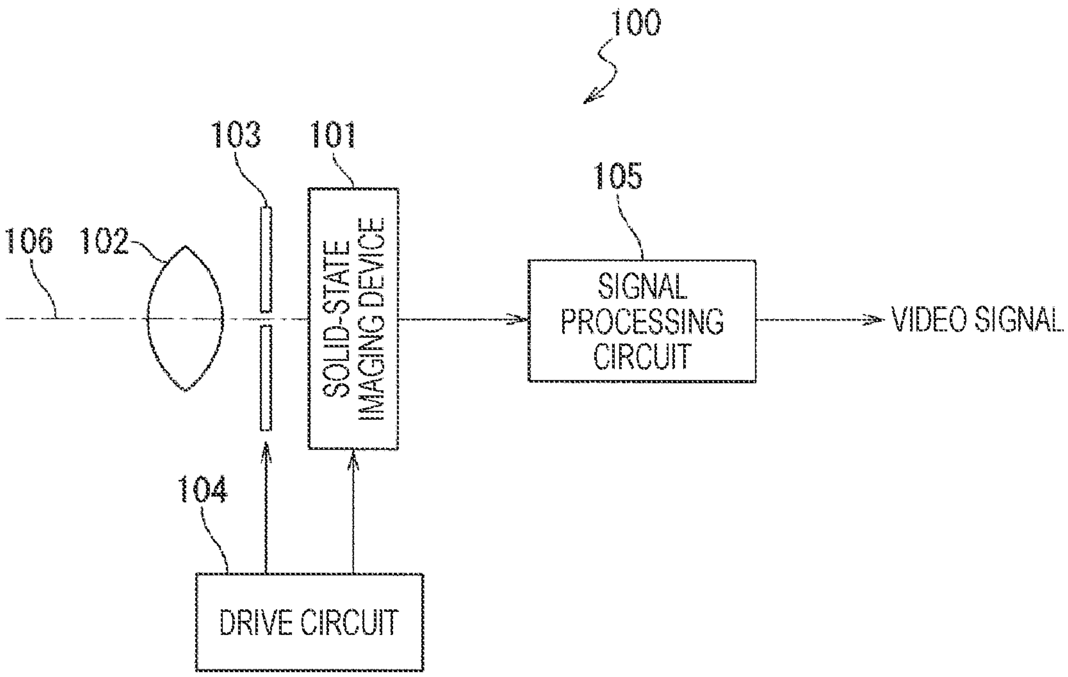
FIG. 11 is a view illustrating a schematic configuration of an electronic device according to a sixth embodiment of the present technology.

As illustrated in FIG. 1, a solid-state imaging device 1A according to the first embodiment of the present technology mainly includes a semiconductor chip 2 having a quadrangular two-dimensional planar shape when viewed in a plan view. That is, the solid-state imaging device 1A is mounted on the semiconductor chip 2. As illustrated in FIG. 11, the solid-state imaging device 1A takes in image light (incident light 106) from a subject via an optical lens 102, and converts a light amount of the incident light 106 formed as an image on an imaging surface into an electrical signal in a unit of a pixel to output the electrical signal as a pixel signal.

As illustrated in FIG. 1, the semiconductor chip 2 includes, in the two-dimensional planar shape, a pixel array section 2A provided at the center thereof and having a rectangular shape, a peripheral section 2B provided outside the pixel array section 2A so as to surround the pixel array section 2A, and a pad arrangement section 2C provided outside the peripheral section 2B so as to surround the peripheral section 2B.

The pixel array section 2A is a light receiving surface that receives light condensed by an optical system not illustrated. Additionally, in the pixel array section 2A, a plurality of pixels 3 is arranged in a matrix on a two-dimensional plane including the X direction and the Y direction.

In the peripheral section 2B, a vertical drive circuit 4, a column signal processing circuits 5, a horizontal drive circuit 6, an output circuit 7, and a control circuit 8 illustrated in FIG. 2, and the like are arranged.

Figure 4A:
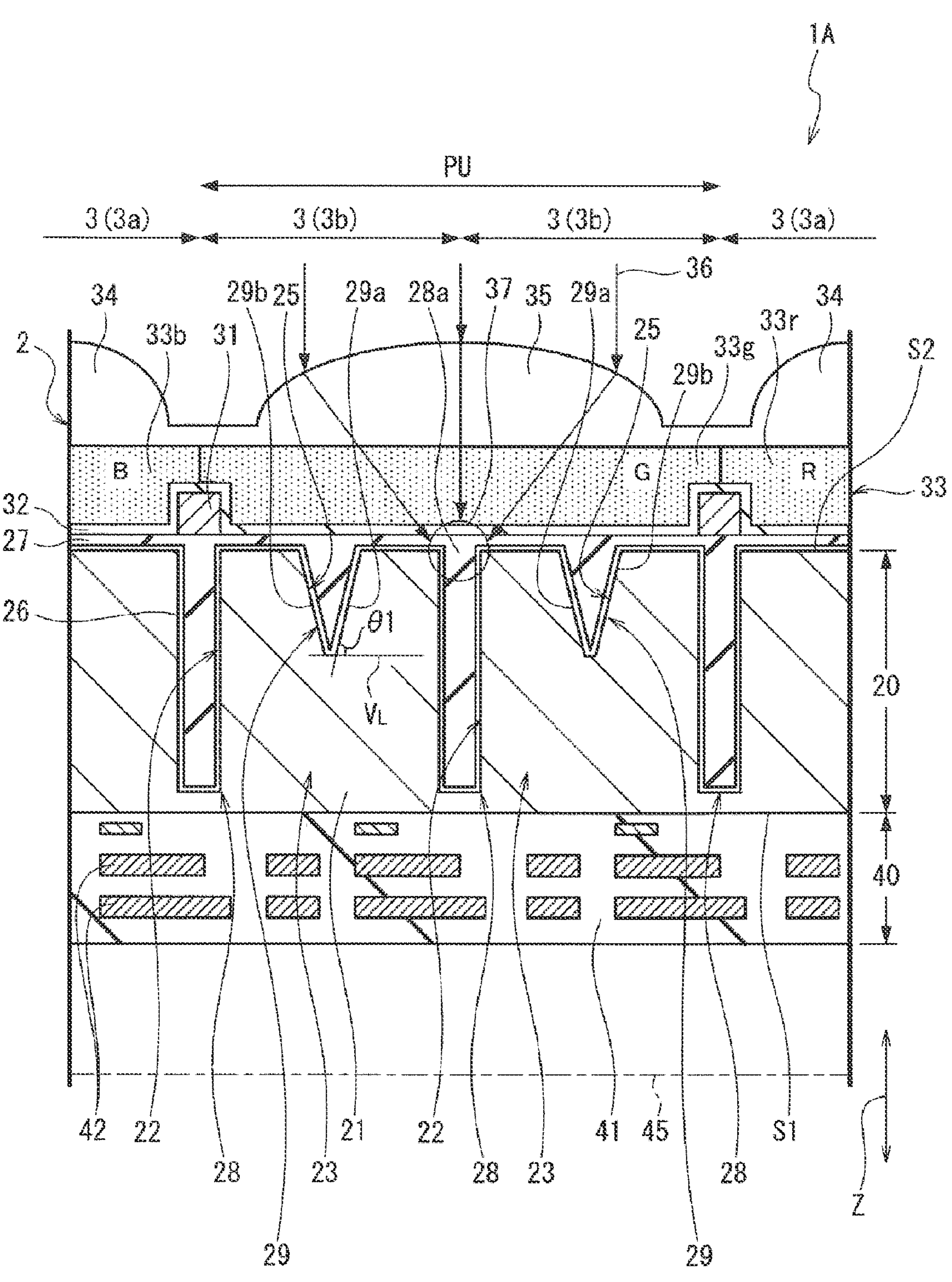
FIG. 4A is a schematic cross-sectional view illustrating a cross-sectional structure taken along line II-II in FIG. 3B.

Each pixel 3 of the plurality of pixels 3 includes a photoelectric conversion section 23 illustrated in FIG. 4A and a plurality of pixel transistors not illustrated. As the plurality of pixel transistors, for example, four transistors of a transfer transistor, a reset transistor, a selection transistor, and an amplification transistor can be adopted. Furthermore, as the plurality of pixel transistors, for example, three transistors excluding the selection transistor may be adopted.

In FIG. 2, the vertical drive circuit 4 includes, for example, a shift register. The vertical drive circuit 4 sequentially selects a desired pixel drive wiring line 10, supplies a pulse for driving pixels 3 to the selected pixel drive wiring line 10, and drives each pixel 3 in a unit of a row. That is, the vertical drive circuit 4 selectively scans each pixel 3 in the pixel array section 2A sequentially in the vertical direction in a unit of a row, and supplies a pixel signal, from the pixel 3, based on a signal charge generated corresponding to a received light amount in the photoelectric conversion section 23 of each pixel 3, to the column signal processing circuit 5 through a vertical signal line 11.

The column signal processing circuit 5 is arranged, for example, for every column of the pixels 3, and performs signal processing such as noise removal on the signals output from pixels 3 of one row for every pixel column. For example, the column signal processing circuit 5 performs signal processing such as correlated double sampling (CDS) for removing fixed pattern noise specific to the pixel and analog digital (AD) conversion.

The horizontal drive circuit 6 includes, for example, a shift register. The horizontal drive circuit 6 sequentially outputs a horizontal scanning pulse to the column signal processing circuit 5 to select each of the column signal processing circuits 5 in sequence, and causes each of the column signal processing circuits 5 to output the pixel signal subjected to the signal processing to a horizontal signal line 12.

The output circuit 7 performs signal processing on the pixel signal sequentially supplied from each of the column signal processing circuit 5 through the horizontal signal line 12, and outputs the pixel signal. As the signal processing, buffering, black level adjustment, column variation correction, various types of digital signal processing, and the like can be used, for example.

The control circuit 8 generates a clock signal and a control signal that is serving as a reference for operations for the vertical drive circuit 4, the column signal processing circuits 5, the horizontal drive circuit 6, and the like on the basis of a vertical synchronization signal, a horizontal synchronization signal, and a master clock signal. Then, the control circuit 8 outputs the generated clock signal and control signal to the vertical drive circuit 4, the column signal processing circuits 5, the horizontal drive circuit 6, and the like.

As illustrated in FIG. 1, in the pad arrangement section 2C, a plurality of electrode pads 13 is arranged along each of four sides in the two-dimensional plane of the semiconductor chip 2. The electrode pads 13 are input/output terminals used when electrically coupling the semiconductor chip 2 to an external device not illustrated.

<Specific Configuration of Solid-State Imaging Device>

Next, a specific configuration of the solid-state imaging device 1A will be described.

As illustrated in FIG. 4A, the semiconductor chip 2 includes the semiconductor layer 20 including a plurality of photoelectric conversion sections 23 partitioned by an isolation region 28, and a color filter layer 33 arranged on a light incident surface side that is a second surface S2 side out of a first surface S1 and a second surface S2 positioned on sides of the semiconductor layer 20 opposite to each other in the thickness direction (Z direction). Furthermore, the semiconductor chip 2 includes on-chip lenses (microlenses) 34 and a shared on-chip lens (shared microlens) 35 arranged on the second surface S2 side of the semiconductor layer 20 with the color filter layer 33 interposed therebetween.

Furthermore, the semiconductor chip 2 further includes a multilayer wiring layer 40 arranged on a first surface S1 side of the semiconductor layer 20, and a support substrate 45 arranged on a side of the multilayer wiring layer 40 opposite to a semiconductor layer 20 side.

As illustrated in FIG. 4A, the multilayer wiring layer 40 is arranged on the first surface S1 side, of the semiconductor layer 20, that is a side opposite to the light incident surface (second surface S2) side, and includes an interlayer insulating film 41 and wiring lines 42 stacked in a plurality of layers through the interlayer insulating film 41. A pixel transistor constituting each pixel 3 is driven via the wiring line 42 of the plurality of layers. The multilayer wiring layer 40 is arranged on a side of the semiconductor layer 20 opposite to the light incident surface side (second surface S2 side). Accordingly, the layout of the wiring lines 42 can be freely set.

As illustrated in FIG. 4A, the support substrate 45 is provided on a surface of the multilayer wiring layer 40 on a side opposite to a side facing the semiconductor layer 20. The support substrate 45 is a substrate for securing the strength of the semiconductor layer 20 in the manufacturing stage of the solid-state imaging device 1A. As a material of the support substrate 45, silicon (Si) can be used, for example.

As illustrated in FIG. 4A, the semiconductor layer 20 includes the isolation region 28 and the plurality of photoelectric conversion sections 23 partitioned by the isolation region 28. The individual photoelectric conversion sections 23 of the plurality of photoelectric conversion sections 23 are arranged in a matrix (X direction and Y direction) corresponding to the individual pixels 3 of the plurality of pixels 3 in the pixel array section 2A. The semiconductor layer 20 includes a p-type semiconductor substrate constituted of single crystal silicon, for example.

Figure 3A:
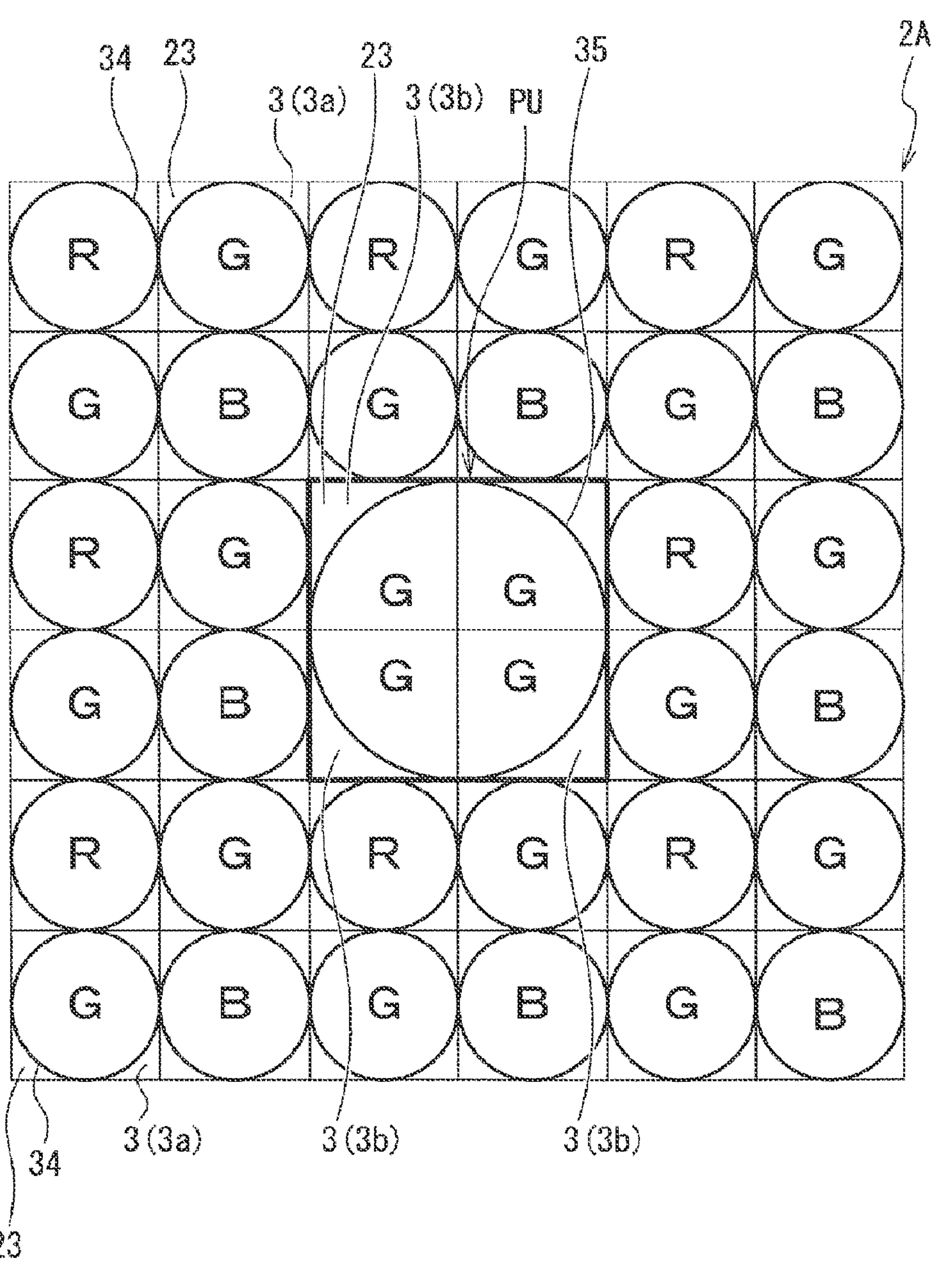
FIG. 3A is a schematic plan view in which a portion of a pixel array section in FIG. 1 is enlarged.
Figure 3B:
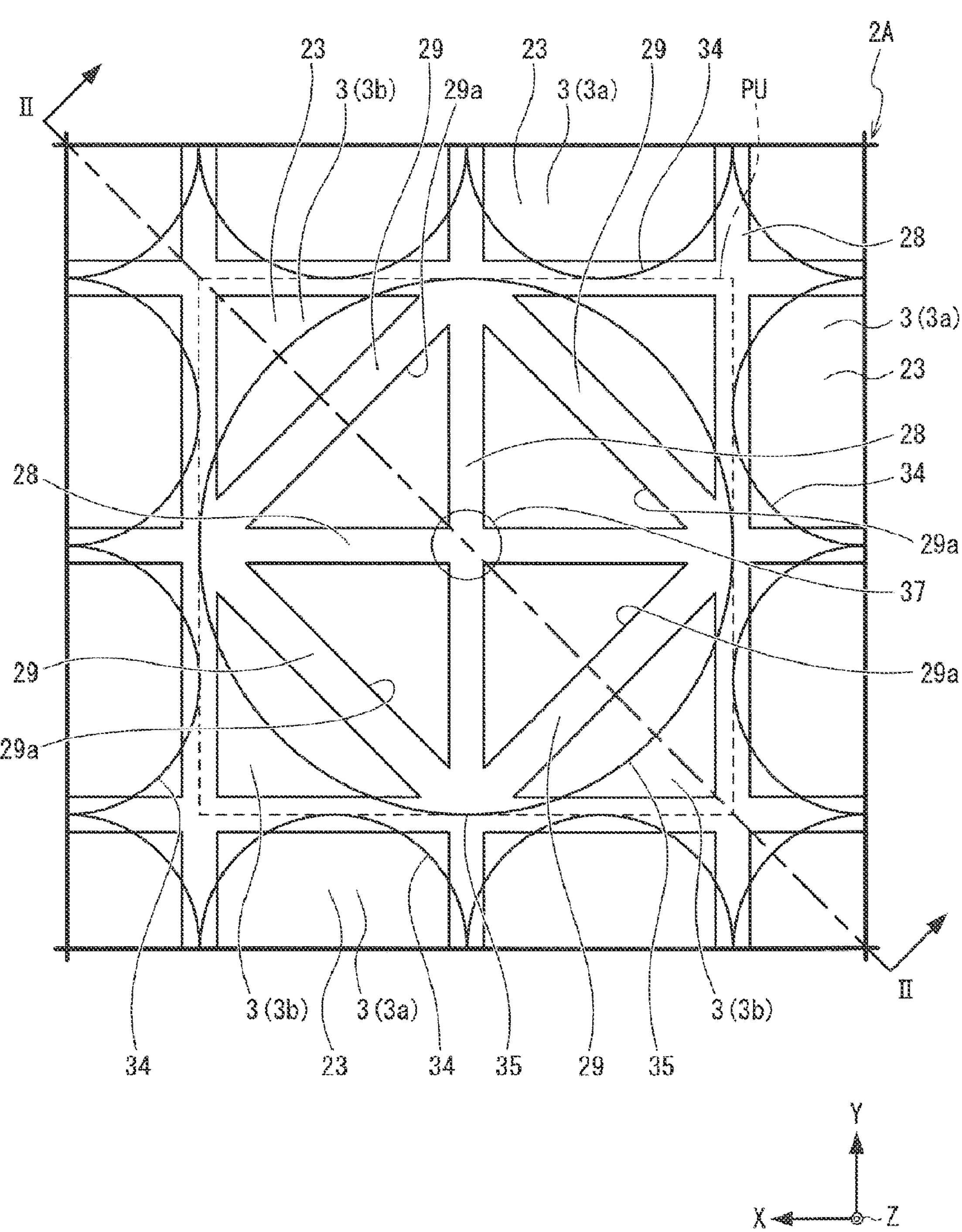
FIG. 3B is a schematic plan view in which a portion of FIG. 3A is enlarged.
Figure 3C:
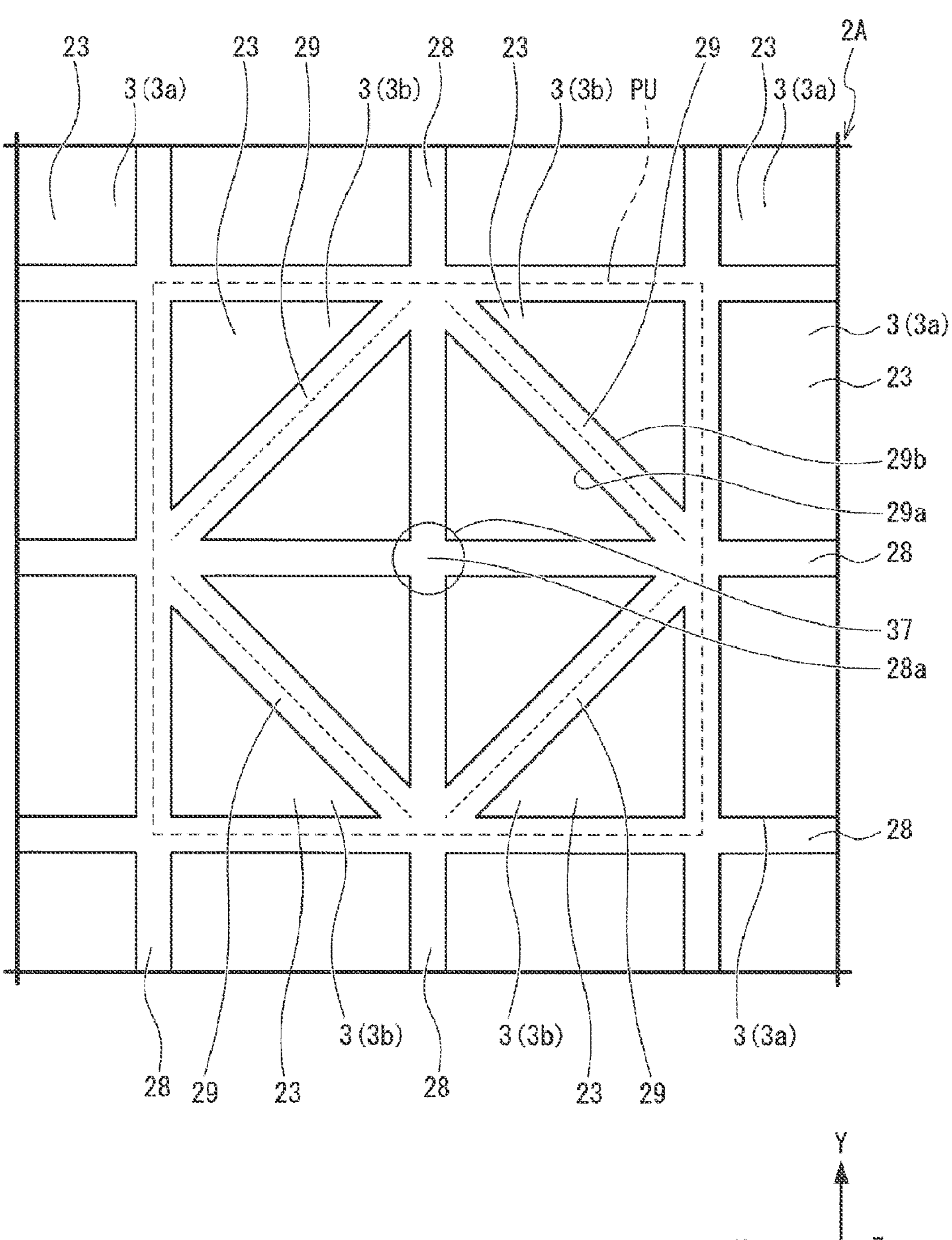

As illustrated in FIGS. 3B, 3C, and 4A, each photoelectric conversion section 23 of the plurality of photoelectric conversion sections 23 has, as a planar shape thereof when viewed in a plan view toward the second surface S2 of the semiconductor layer 20, a planar pattern having a quadrangular shape. Additionally, the plurality of photoelectric conversion sections 23 has a dot planar pattern in which the photoelectric conversion sections 23 are repeatedly arranged with the isolation region 28 interposed therebetween in both the X direction and the Y direction in a plan view.

The isolation region 28 extends from the second surface S2 of the semiconductor layer 20 toward the first surface S1, and electrically and optically isolates the adjacent photoelectric conversion sections 23 from each other. Additionally, the isolation region 28 corresponding to one pixel 3 has, as the planar pattern thereof in a plan view, an annular planar pattern having a quadrangular shape. Additionally, although not illustrated in FIGS. 3B and 3C in detail, the isolation region 28 corresponding to the entire pixel array section 2A has, as the planar pattern thereof in a plan view, a composite planar pattern in which a lattice-shaped planar pattern is included in a quadrangular annular planar pattern.

Each photoelectric conversion section 23 of the plurality of photoelectric conversion sections 23 includes an n-type well region 21 constituted of an n-type semiconductor region, for example. Furthermore, not illustrated in detail, each photoelectric conversion section 23 of the plurality of photoelectric conversion sections 23 includes, for example, an avalanche photo diode (APD) element as a photoelectric conversion element, and further includes a pixel transistor. That is, in the pixel array section 2A, the plurality of pixels 3 including the photoelectric conversion sections 23 provided in an embedded manner in the semiconductor layer 20 is arranged in a matrix (two-dimensional matrix).

As illustrated in FIG. 4A, the isolation region 28 has an embedded structure in which an insulating film 27 is embedded in an isolation groove portion 22 extending from the second surface S2 side toward the first surface S1 side of the semiconductor layer 20 with a functional layer 26 interposed therebetween. The functional layer 26 is provided so as to cover an inner wall surface and a bottom surface of the isolation groove portion 22, cover inner wall surfaces and bottom surfaces of reflection groove portions 25 described later, and further cover the second surface S2 side of the semiconductor layer 20. The insulating film 27 is embedded in each of the isolation groove portion 22 and the reflection groove portions 25 via the functional layer 26 interposed therebetween, and provided on the second surface S2 side of the semiconductor layer 20 with the functional layer 26 interposed therebetween.

The functional layer 26 includes a fixed charge film and an antireflection film for suppressing dark current due to working damage of the semiconductor layer 20. As a fixed charge accumulation film, aluminum oxide (AlO), hafnium oxide (HfO), or the like can be used, for example. As the insulating film 27, tantalum oxide (TaO), titanium oxide (TiO), or the like can be used, for example.

As illustrated in FIG. 4A, the color filter layer 33 includes, but is not limited to, red (R) first color filter portions 33*r*, green (G) second color filter portions 33*g*, and blue (B) third color filter portions 33*b*, for example. In the pixel array section 2A, the first to third color filter portions 33*r*, 33*g*, and 33*b* are arranged in a matrix corresponding to the individual pixels 3 of the plurality of pixels 3, that is, the individual photoelectric conversion sections 23 of the plurality of photoelectric conversion sections 23. The first to third color filter portions 33*r*, 33*g*, and 33*b* are randomly arranged, and the numbers thereof are not necessarily the same. In the first embodiment, for example, more green (G) second color filter portions 33*g* are provided than the red (R) first color filter portions 33*r* and the blue (B) third color filter portions 33*b*. In the first embodiment, as illustrated in FIG. 3A, two pixels 3 are set as one unit, for example, and the red (R) first color filter portions 33*r*, the green (G) second color filter portions 33*g*, and the blue (B) third color filter portions 33*b* are arranged in Bayer array. Each of the first to third color filter portions 33*r*, 33*g*, and 33*b* is configured to transmit a specific wavelength of incident light desired to be received by the photoelectric conversion section 23, and causes the transmitted incident light to enter the photoelectric conversion section 23.

As illustrated in FIGS. 3A, 3B, and 4A, the on-chip lens 34 is arranged for each pixel 3, that is, for each photoelectric conversion section 23. The on-chip lens 34 condenses the incident light (irradiation light), and causes the condensed light to efficiently enter the photoelectric conversion section 23 of the semiconductor layer 20 through the color filter layer 33. A condensing point of the on-chip lens 34 is positioned at the center portion of the photoelectric conversion section 23 in a plan view.

As illustrated in FIGS. 3A, 3B, and 4A, the shared on-chip lens 35 is shared by a plurality of photoelectric conversion sections 23 adjacent to each other with the isolation region 28 interposed therebetween. In the first embodiment, one shared on-chip lens 35 is shared by four photoelectric conversion sections 23 arranged two by two (2×2 arrangement) in both the X direction and the Y direction orthogonal to each other in a plan view. That is, the plurality of pixels 3 includes pixels 3*a* each corresponding to one on-chip lens, and pixels 3*b* that share one shared on-chip lens 35 by a plurality of pixels. Four pixels 3*b* that share one shared on-chip lens 35 constitute one pixel unit PU.

As illustrated in FIG. 4A, the shared on-chip lens 35 shared by the four photoelectric conversion sections 23 condenses incident light (irradiation light) 36, and causes the condensed light to efficiently enter the photoelectric conversion section 23 of the semiconductor layer 20 through the color filter layer 33. As illustrated in FIGS. 3B and 4A, a condensing point 37 of the shared on-chip lens 35 is positioned at an intersection portion 28*a* where the isolation region 28 extending in the X direction and the isolation region 28 extending in the Y direction intersect at the center portion of the four photoelectric conversion sections 23 (pixel unit PU) that share the shared on-chip lens. The shared on-chip lens 35 and above-described on-chip lenses 34 are formed in the same step in a process of manufacturing the solid-state imaging device 1A, and include a material such as STSR or CSiL, for example.

As illustrated in FIGS. 3A and 3B, the four pixels 3*b* of the pixel unit PU include the green (G) second color filter portions 33*g*. Additionally, the pixel 3*b* of the pixel unit PU is adjacent to the pixel 3*a* of the same color or the pixel 3*a* of a different color arranged around the pixel unit PU. Among the pixels 3*a* adjacent to the pixels 3*b* of the pixel unit PU, the pixels 3*a* positioned on one of two diagonals of the pixel unit PU having a quadrangular-shaped plane include the color filter portions 33*r* and 33*b*, which are colors different from the color filter portions 33*g* of the pixels 3*b* of the pixel unit PU.

The pixel unit PU is used as a phase difference detection pixel for pupil splitting of incident light in addition to a normal pixel for obtaining a pixel signal (color signal) that constitutes an image, for example.

As illustrated in FIGS. 3B, 3C, and 4A, each of the four photoelectric conversion sections 23 that share one shared on-chip lens 35 includes a light reflector 29 as a concave portion that causes light obtained by scattering the incident light 36 condensed at the condensing point 37 of the shared on-chip lens 35 due to a refractive index difference between the photoelectric conversion section 23 and the isolation region 28 at the condensing point 37 to be reflected toward the first surface S1 side of the semiconductor layer 20. The light reflectors 29 are provided in the upper portions of the photoelectric conversion sections 23 that share the shared on-chip lens 35 on the light incident surface (second surface S2) side of the semiconductor layer 20.

The light reflector 29 has an embedded structure in which the insulating film 27 is embedded in the reflection groove portion 25 extending from the second surface S2 side toward the first surface S1 side of the semiconductor layer 20 with the functional layer 26 interposed therebetween. Furthermore, the light reflector 29 has a wedge shape in which the width thereof gradually decreases from the second surface S2 side toward the first surface S1 side of the semiconductor layer 20. Furthermore, the light reflector 29 extends along a diagonal on which the condensing point 37 of the shared on-chip lens 35 is not positioned out of two diagonals of the photoelectric conversion section 23 in a plan view, and both ends thereof are connected to the isolation region 28. That is, the light reflector 29 is separated from the condensing point 37 and in contact with the isolation region 28. Furthermore, the light reflector 29 has a depth from the second surface S2 side toward the first surface S1 side of the semiconductor layer 20 shallower than the depth of the isolation region 28, that is, the depth from the second surface S2 side of the semiconductor layer 20 is shallower than that of the isolation region 28.

Furthermore, the light reflector 29 has an inclined surface 29*a* that is positioned on a side facing the condensing point 37 in a plan view, that is, a condensing point 37 side, and is inclined such that an inclination angle θ1 on an inner angle side formed by the inclined surface 29*a* and a virtual line $V_L$ orthogonal to the thickness direction (Z direction) of the semiconductor layer 20 is an acute angle.

Additionally, when the refractive index of the photoelectric conversion section 23 is n1 and the refractive index of the light reflector 29 is n2, the inclination angle θ1 satisfies the following Formula (1).

$$\theta 1 \leq \theta = 90 - \arcsin(n2/n1) \quad (1)$$

In the first embodiment, the photoelectric conversion section 23 includes a silicon layer, and the isolation region 28 includes a silicon oxide film. Additionally, the refractive index n1 of silicon is approximately 3.9, and the refractive index n2 of silicon oxide is approximately 1.4. Accordingly, the light reflector 29 in the first embodiment has the inclined surface 29*a* inclined at an inclination angle θ1=67°. The inclined surface 29*a* extends in a direction of the inclination angle θ1=67°, and extends along the diagonal on which the condensing point 37 of the shared on-chip lens 35 is not positioned.

Note that the light reflector 29 has an inclination 29*b* inclined under the same condition as the inclined surface 29*a* on a side opposite to the inclined surface 29*a*.

As illustrated in FIG. 4A, between the semiconductor layer 20 and the color filter layer 33, a light shielding film 31 and an adhesive film 32 are stacked in this order from the semiconductor layer 20 side.

The light shielding film 31 has, as the planar pattern thereof in a plan view, a lattice-shaped planar pattern in which the light receiving surface side of each of the plurality of photoelectric conversion sections 23 opens so that light of a predetermined pixel 3 does not leak to the adjacent pixel 3. Additionally, the light shielding film 31 corresponding to the pixel 3*a* around the pixel unit PD has, as the planar pattern thereof in a plan view, an annular planar pattern having a quadrangular shape. Additionally, the light shielding film 31 corresponding to one pixel unit PD (four pixels 4*b*) having four pixels 3*b* as one unit has, as the planar pattern thereof in a plan view, an annular planar pattern having a quadrangular shape extending along an outer periphery of the four pixels 3*b*, and the light shielding film 31 is not provided between two pixels 4*b* adjacent to each other. As the light shielding film 31, a tungsten (W) film can be used, for example.

The adhesive film 32 is arranged between the insulating film 27 and the light shielding film 31 and the color filter layer 33, and enhances adhesion mainly between the light shielding film 31 and the color filter layer 33. As the adhesive film 32, a silicon oxide film can be used, for example.

In the solid-state imaging device 1A having the above-described configuration, the semiconductor chip 2 is irradiated with incident light from the on-chip lens 34 and shared on-chip lens 35 side, the irradiated incident light is individually transmitted through the on-chip lenses 34, the shared on-chip lens 35, and the color filter portions 33*r*, 33*g*, and 33*b*, and the transmitted light is photoelectrically converted by the photoelectric conversion sections 23, so that signal charges are generated. Then, the generated signal charges are output as pixel signals by the vertical signal lines 11 constituted of the wiring lines 42 of the multilayer wiring layer 40 via the pixel transistors formed on the first surface side of the semiconductor layer 20. Furthermore, the distance to the subject is calculated on the basis of the difference between the signal charges generated by the photoelectric conversion sections 23.

<<Method for Manufacturing Solid-State Imaging Device>>

Next, a method for manufacturing the solid-state imaging device 1A according to the first embodiment will be described with reference to FIGS. 5A to 5K.

Figure 5A:
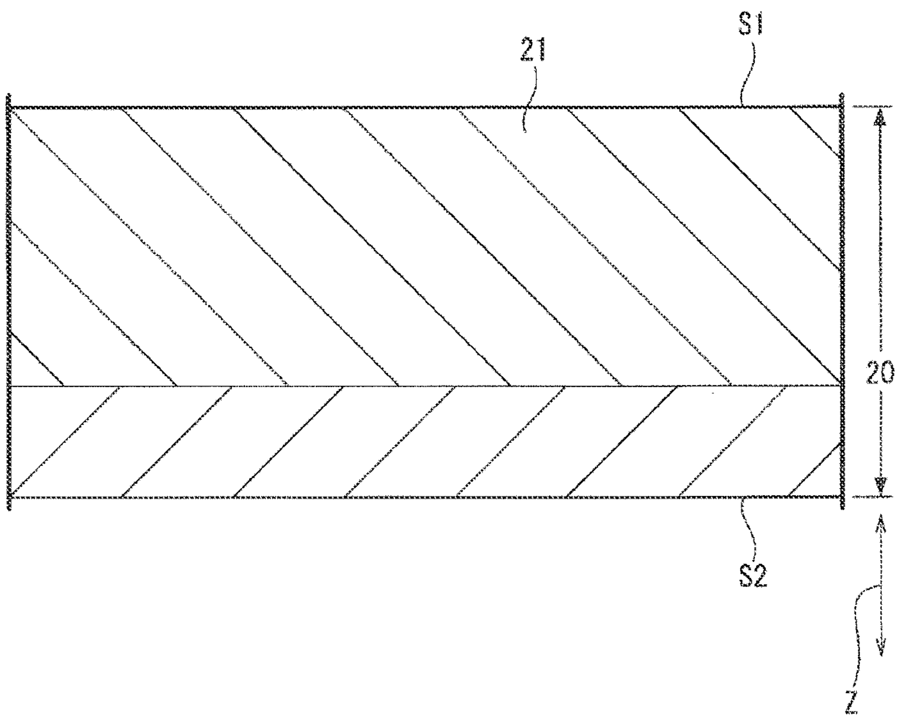
FIG. 5A is a cross-sectional view of a step of a method for manufacturing the solid-state imaging device according to the first embodiment of the present technology.

First, the semiconductor layer 20 illustrated in FIG. 5A is prepared. As the semiconductor layer 20, a single crystal silicon substrate is used, for example.

Next, as illustrated in FIG. 5A, the well region 21 constituted of an n-type semiconductor region is formed on the first surface S1 side of the semiconductor layer 20.

Figure 5B:
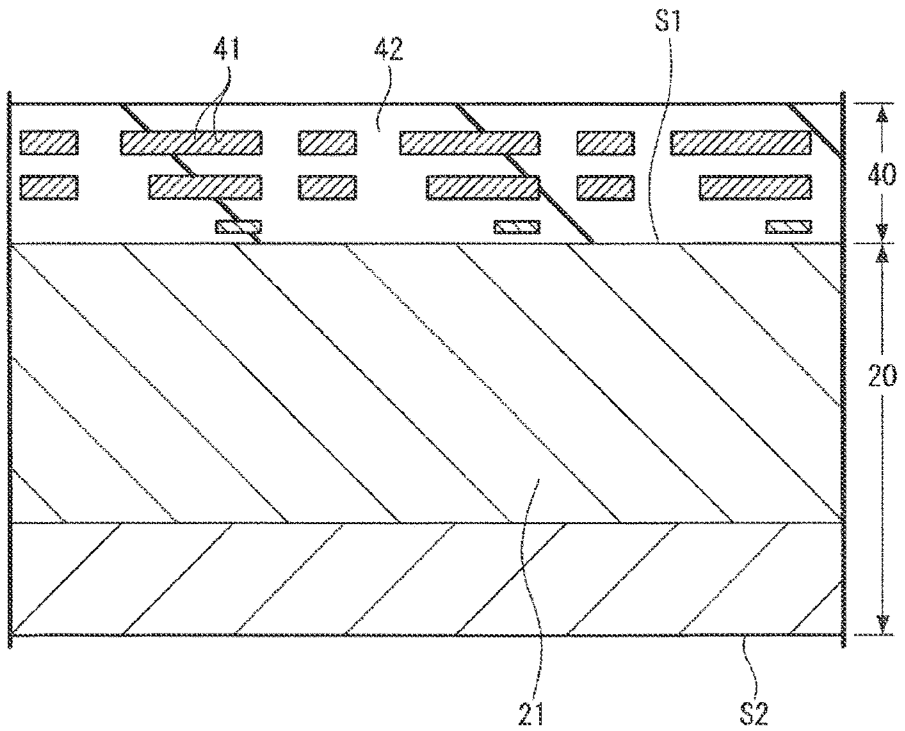
FIG. 5B is a cross-sectional view of a step performed subsequent to the step in FIG. 5A.

Next, although not illustrated, transistors constituting the vertical drive circuit 4, the column signal processing circuits 5, the horizontal drive circuit 6, the output circuit 7, the control circuit 8, and the like are formed on the first surface S1 side of the semiconductor layer 20, and as illustrated in FIG. 5B, the multilayer wiring layer 40 including the interlayer insulating film 41 and the wiring lines 42 stacked in a plurality of layers through the interlayer insulating film 41 is formed on the first surface S1 side of the semiconductor layer 20.

Figure 5C:
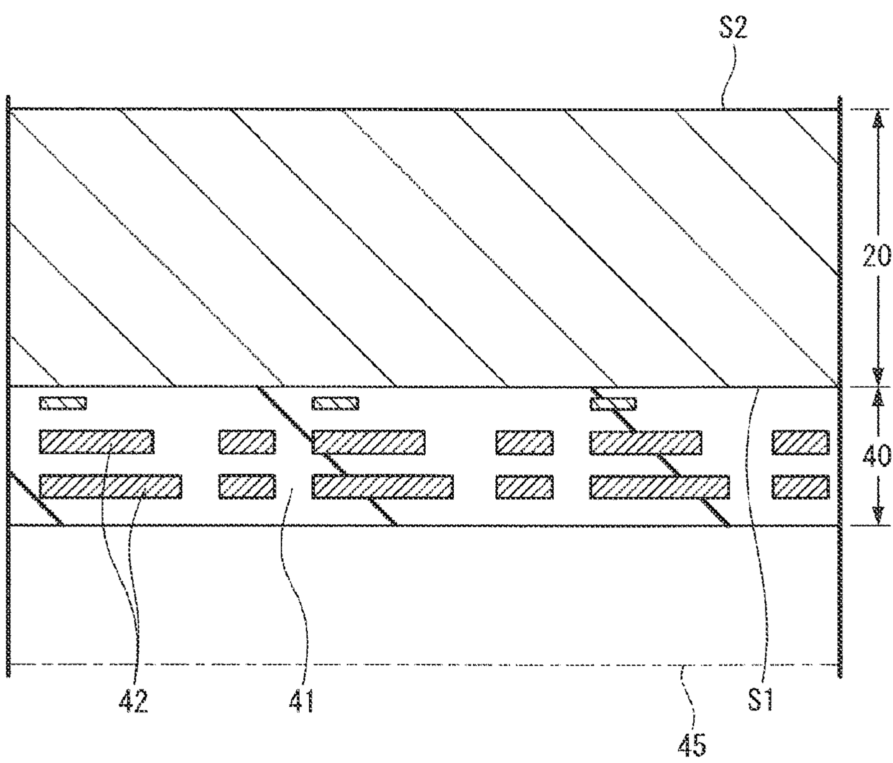
FIG. 5C is a cross-sectional view of a step performed subsequent to the step in FIG. 5B.

Next, as illustrated in FIG. 5C, the support substrate 45 is bonded to the multilayer wiring layer 40 on a side opposite to the semiconductor layer 20 side. Then, as illustrated in FIG. 5D, the second surface (light incident surface) S2 side of the semiconductor layer 20 is ground by a CMP method or the like to reduce the thickness of the semiconductor layer 20.

Figure 5D:
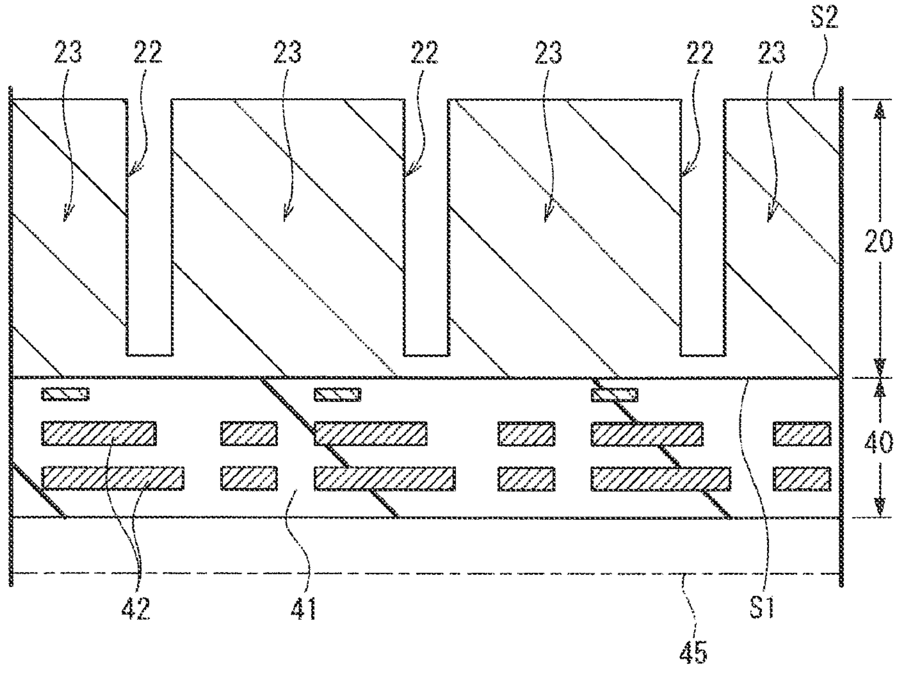
FIG. 5D is a cross-sectional view of a step performed subsequent to the step in FIG. 5C.

Next, as illustrated in FIG. 5D, a plurality of photoelectric conversion sections 23 each of which is partitioned by the isolation groove portion 22 is formed on the second surface S2 side of the semiconductor layer 20. Each of the plurality of photoelectric conversion sections 23 is constructed by forming the isolation groove portion 22, the APD element, the pixel transistor, and the like on the second surface S2 side of the semiconductor layer 20. The isolation groove portion 22 is formed by using a known photolithography technique and a dry etching technique such as reactive ion etching (RIE). The isolation groove portion 22 defines plane size of the photoelectric conversion section 23 and pixel size. That is, the isolation groove portion 22 has, as the planar pattern thereof in a plan view, a composite planar pattern in which a lattice-shaped planar pattern that defines the pixel size is included in a quadrangular annular planar pattern that defines the pixel array section 2A.

Figure 5E:
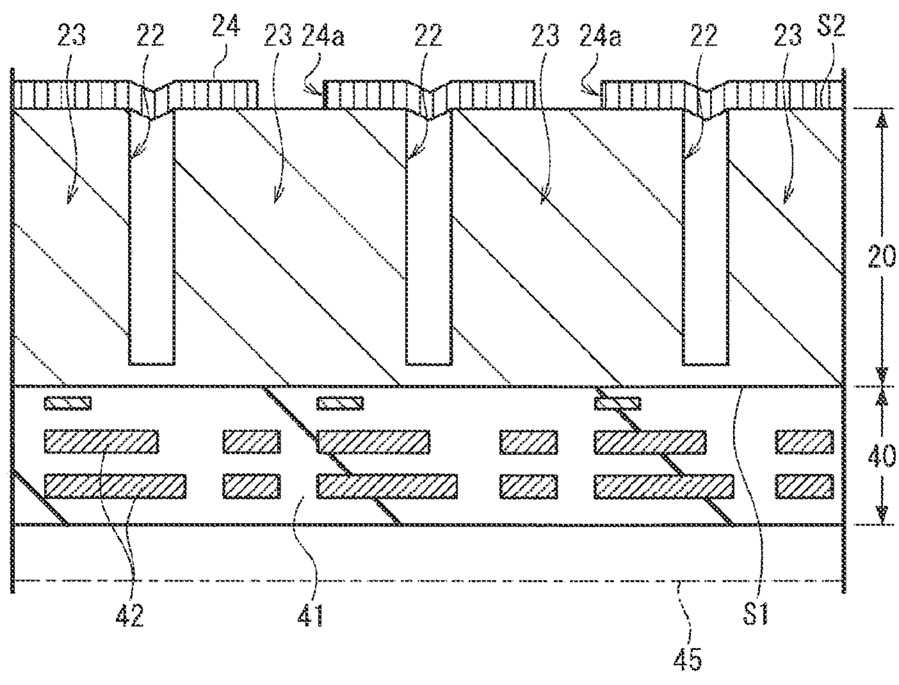
FIG. 5E is a cross-sectional view of a step performed subsequent to the step in FIG. 5D.

Next, as illustrated in FIG. 5E, an etching mask 24 that covers the isolation groove portion 22 and the photoelectric conversion sections 23 and has opening portions 24*a* at formation regions of the reflection groove portions 25 is formed on the second surface S2 side of the semiconductor layer 20. The etching mask 24 is formed such that a mask material having poor coverage properties such as an oxide film, for example, is formed by a CVD method, and thereafter, the mask material is patterned by using a photolithography technique.

Figure 5F:
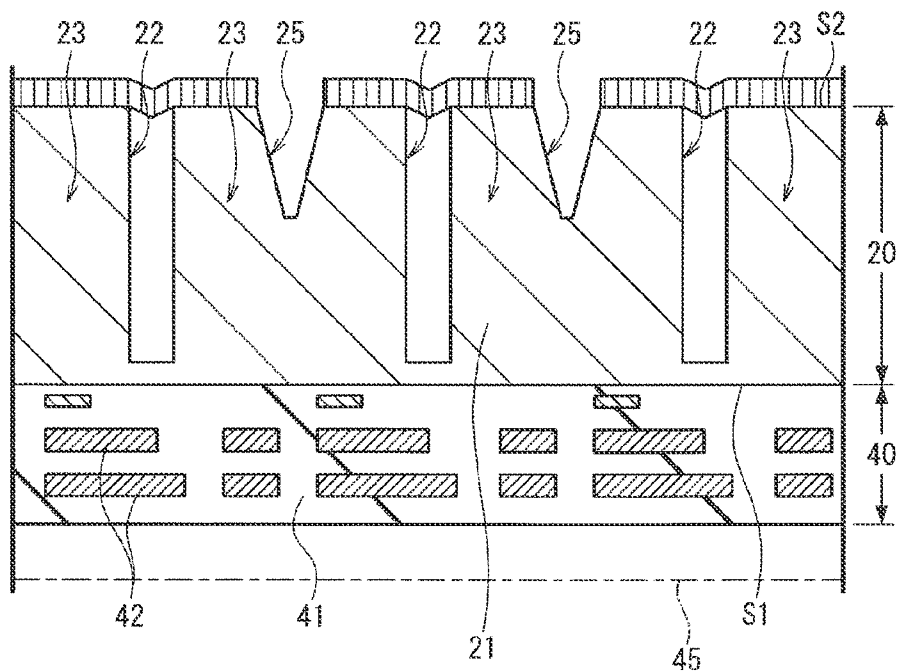
FIG. 5F is a cross-sectional view of a step performed subsequent to the step in FIG. 5E.

Next, as illustrated in FIG. 5F, the photoelectric conversion sections 23 exposed from the opening portions 24*a* of the etching mask 24 are etched to form the reflection groove portions 25. The reflection groove portion 25 is formed in each of the four photoelectric conversion sections 23 that share one shared on-chip lens 35, in other words, in each of the four photoelectric conversion sections 23 that constitute one pixel unit PU. The reflection groove portion 25 is formed in a wedge shape in which the width thereof gradually decreases from the second surface S2 side toward the first surface S1 side of the semiconductor layer 20 in the thickness direction (Z direction) of the semiconductor layer 20. Furthermore, the reflection groove portion 25 extends along a diagonal on which the condensing point 37 of the shared on-chip lens 35 is not positioned out of two diagonals of the photoelectric conversion section 23 in a plan view, and both ends thereof are connected to the isolation groove portion 22. The reflection groove portions 25 are formed by etching the photoelectric conversion sections 23 by using a dry etching technique such as RIE.

Figure 5G:
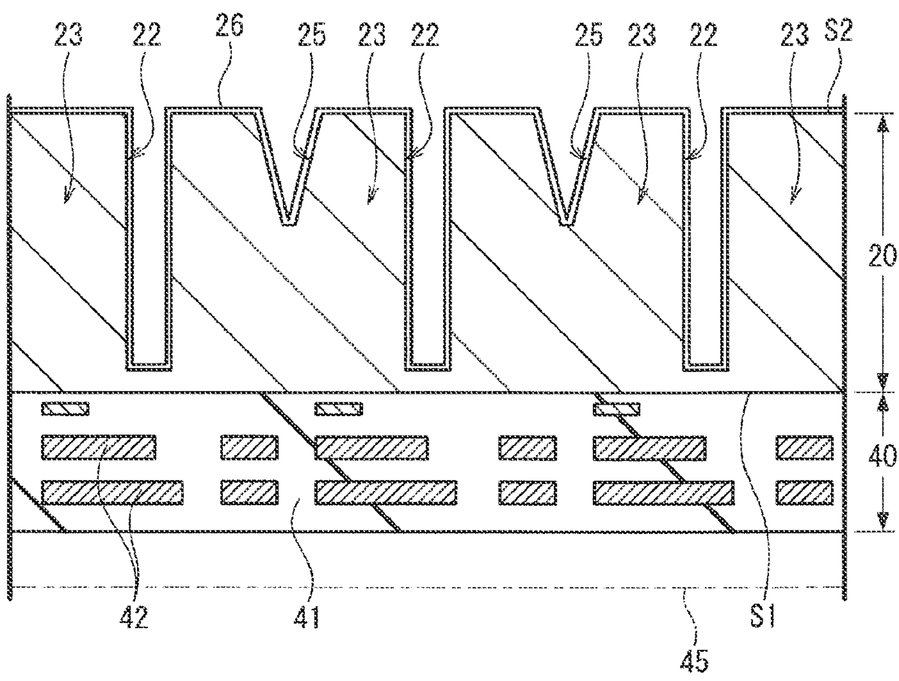
FIG. 5G is a cross-sectional view of a step performed subsequent to the step in FIG. 5F.

Next, after the etching mask 24 is removed, as illustrated in FIG. 5G, the functional layer 26 that covers the semiconductor layer 20 in the isolation groove portion 22 and in the reflection groove portions 25, and also covers the second surface S2 side of the semiconductor layer 20 is formed. The functional layer 26 is formed such that a fixed charge film such as, for example, aluminum oxide (AlO) or hafnium oxide (HfO) is formed, and thereafter, an antireflection film such as tantalum oxide (TaO) or titanium oxide (TiO) is formed.

Figure 5H:
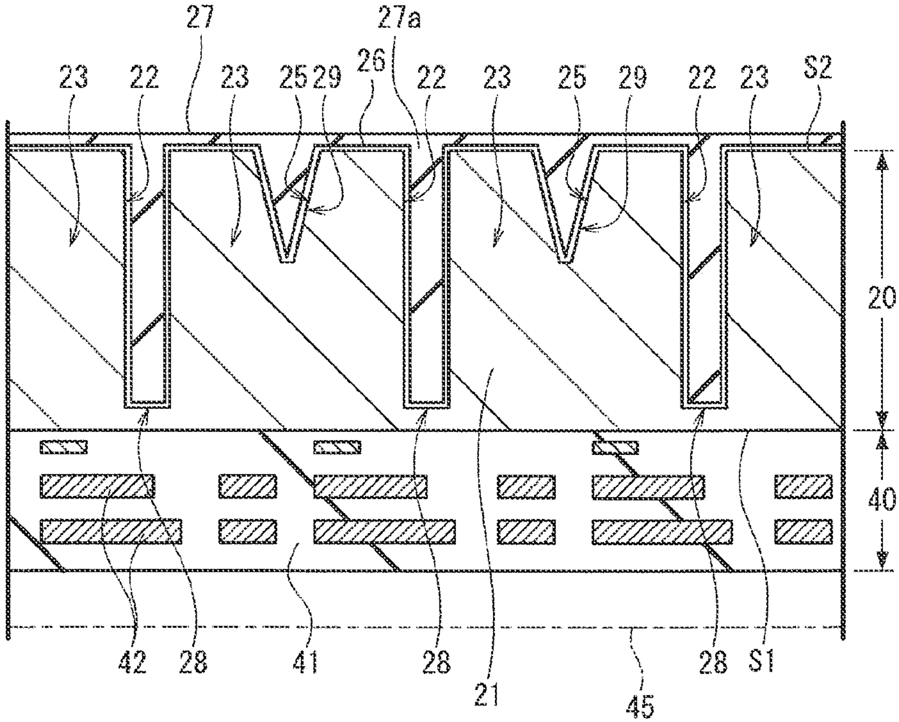
FIG. 5H is a cross-sectional view of a step performed subsequent to the step in FIG. 5G.

Next, as illustrated in FIG. 5H, the insulating film 27 is formed on the second surface S2 of the semiconductor layer 20 with the functional layer 26 interposed therebetween, and the insulating film 27 is embedded in the isolation groove portion 22 and in the reflection groove portions 25 with the functional layer 26 interposed therebetween. The insulating film 27 can be formed such that a silicon oxide film, for example, is formed by a CVD method over the entire surface of the second surface S2 of the semiconductor layer 20 including both the inside of the isolation groove portion 22 and the inside of the reflection groove portions 25, and thereafter, the surface of the silicon oxide film on the second surface S2 of the semiconductor layer 20 is ground by a CMP method, an etch back method, or the like to reduce the thickness.

By this step, as illustrated in FIG. 5H, the isolation region 28 having an embedded structure in which the insulating film 27 is embedded in the isolation groove portion 22 with the functional layer 26 interposed therebetween is formed. Furthermore, the light reflectors 29 having an embedded structure in which the insulating film 27 is embedded in the reflection groove portions 25 with the functional layer 26 interposed therebetween are formed. Furthermore, the photoelectric conversion sections 23 partitioned by the isolation region 28 and including the light reflectors 29 are formed.

Figure 5I:
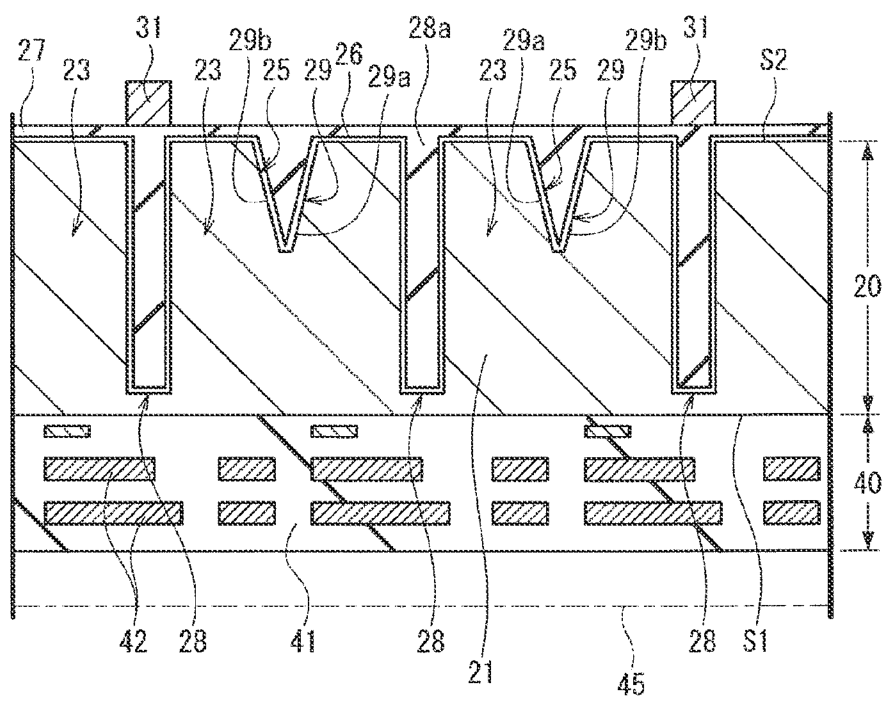
FIG. 5I is a cross-sectional view of a step performed subsequent to the step in FIG. 5H.

Next, as illustrated in FIG. 5I, the light shielding film 31 is formed on the second surface S2 side of the semiconductor layer 20. The light shielding film 31 is formed such that, for example, a tungsten (W) film is formed on the insulating film 27 as a high-melting-point metal film by a sputtering method, and thereafter, the tungsten film is turned into a predetermined pattern by using a known photolithography technique. The light shielding film 31 is formed to have, as the planar pattern thereof in a plan view, a lattice-shaped planar pattern in which the light receiving surface side of each of the plurality of photoelectric conversion sections 23 opens.

Note that the light shielding film 31 corresponding to the four photoelectric conversion sections 23 that share one shared on-chip lens 35 has, as the planar pattern thereof in a plan view, an annular planar pattern having a quadrangular shape extending along the outer periphery of the four photoelectric conversion sections 23, and the light shielding film 31 is not provided between two photoelectric conversion sections 23 adjacent to each other.

Figure 5J:
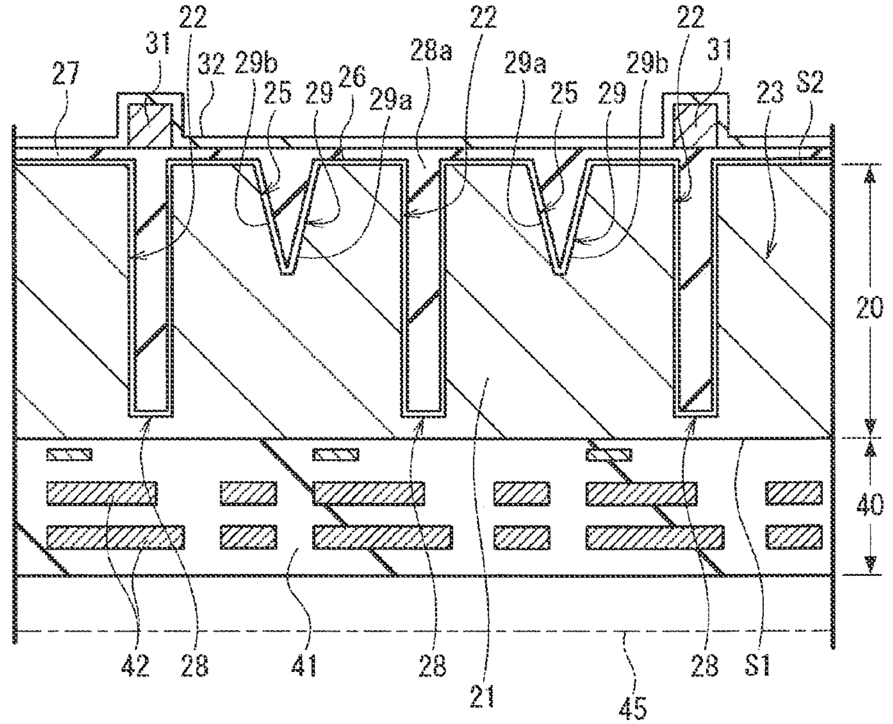
FIG. 5J is a cross-sectional view of a step performed subsequent to the step in FIG. 5I.

Next, as illustrated in FIG. 5J, the adhesive film 32 is formed on the second surface S2 side of the semiconductor layer 20. The adhesive film 32 is formed such that a silicon oxide film, for example, is formed on the entire surface of the insulating film 27 including the light shielding film 31 by a CVD method. The adhesive film 32 is formed with a film thickness smaller than the thickness of the light shielding film 31 so as to form concave portions in regions surrounded by the light shielding film 31.

Figure 5K:
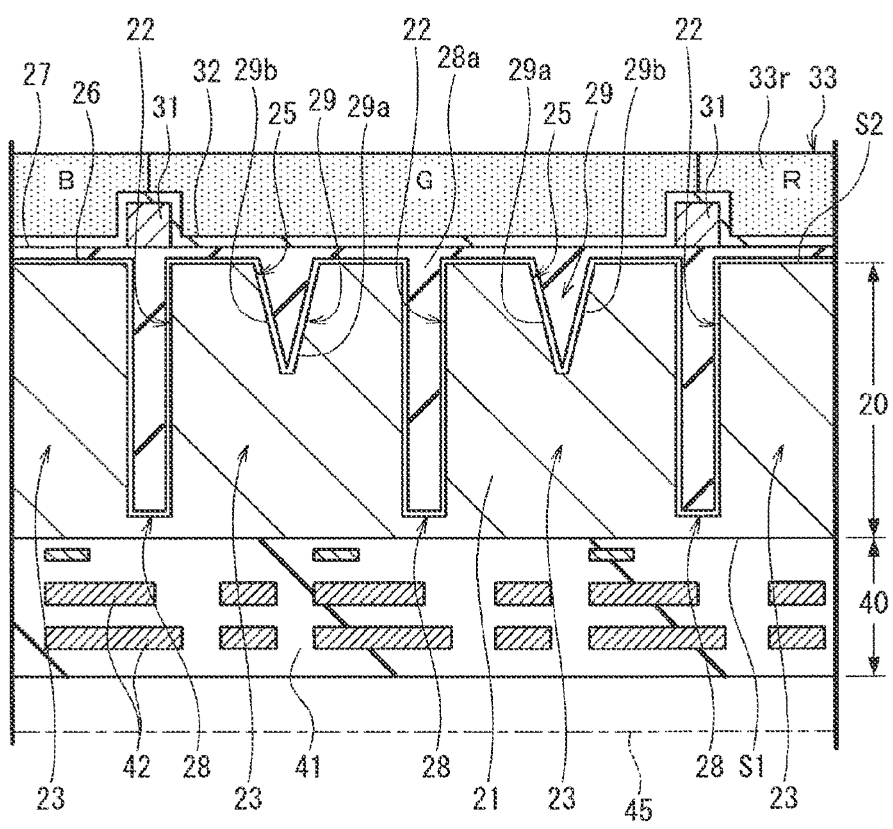
FIG. 5K is a cross-sectional view of a step performed subsequent to the step in FIG. 5J.

Next, as illustrated in FIG. 5K, the color filter layer 33 including the red (R) first color filter portions 33*r*, the green (G) second color filter portions 33*g*, and the blue (B) color filter portions 33*b* is formed on the second surface S2 side of the semiconductor layer 20. The first to third color filter portions 33*r*, 33*g*, and 33*b* are formed such that organic films having spectral characteristics of corresponding colors (red, green, and blue) are formed and patterned. The first to third color filter portions 33*r*, 33*g*, and 33*b* are formed in a matrix corresponding to the individual pixels 3 of the plurality of pixels 3, that is, the individual photoelectric conversion sections 23 of the plurality of photoelectric conversion sections 23.

Note that in each of the four photoelectric conversion sections 23 that share one shared on-chip lens 35, the second color filter portion 33*g* of the same color is formed.

Next, as illustrated in FIG. 4A, the on-chip lenses 34 and the shared on-chip lens 35 are formed on the second surface S2 side of the semiconductor layer 20, that is, the light incident surface side of the color filter layer 33. The on-chip lenses 34 and the shared on-chip lens 35 are formed by an etch back method using a photosensitive resist film, for example. The shared on-chip lens 35 is formed corresponding to the four photoelectric conversion sections 23 that constitute the pixel unit PU. The on-chip lenses 34 are formed corresponding to the photoelectric conversion sections 23 arranged outside the four photoelectric conversion sections 23 that constitute the pixel unit PU.

Through these steps, a semiconductor substrate body including the semiconductor layer 20, the multilayer wiring layer 40, the light shielding film 31, the adhesive film 32, the color filter layer 33, the on-chip lenses 34, the shared on-chip lens 35, and the like is formed. Furthermore, the solid-state imaging device 1A including the shared on-chip lens 35 is almost completed. The solid-state imaging device 1A is formed on each of a plurality of chip formation regions partitioned by scribe lines (dicing lines) on a semiconductor substrate body. Then, by individually dividing the plurality of chip formation regions along the scribe lines, the semiconductor chip 2 on which the solid-state imaging device 1A is mounted is formed.

Main Advantageous Effects of First Embodiment

Figure 4B:
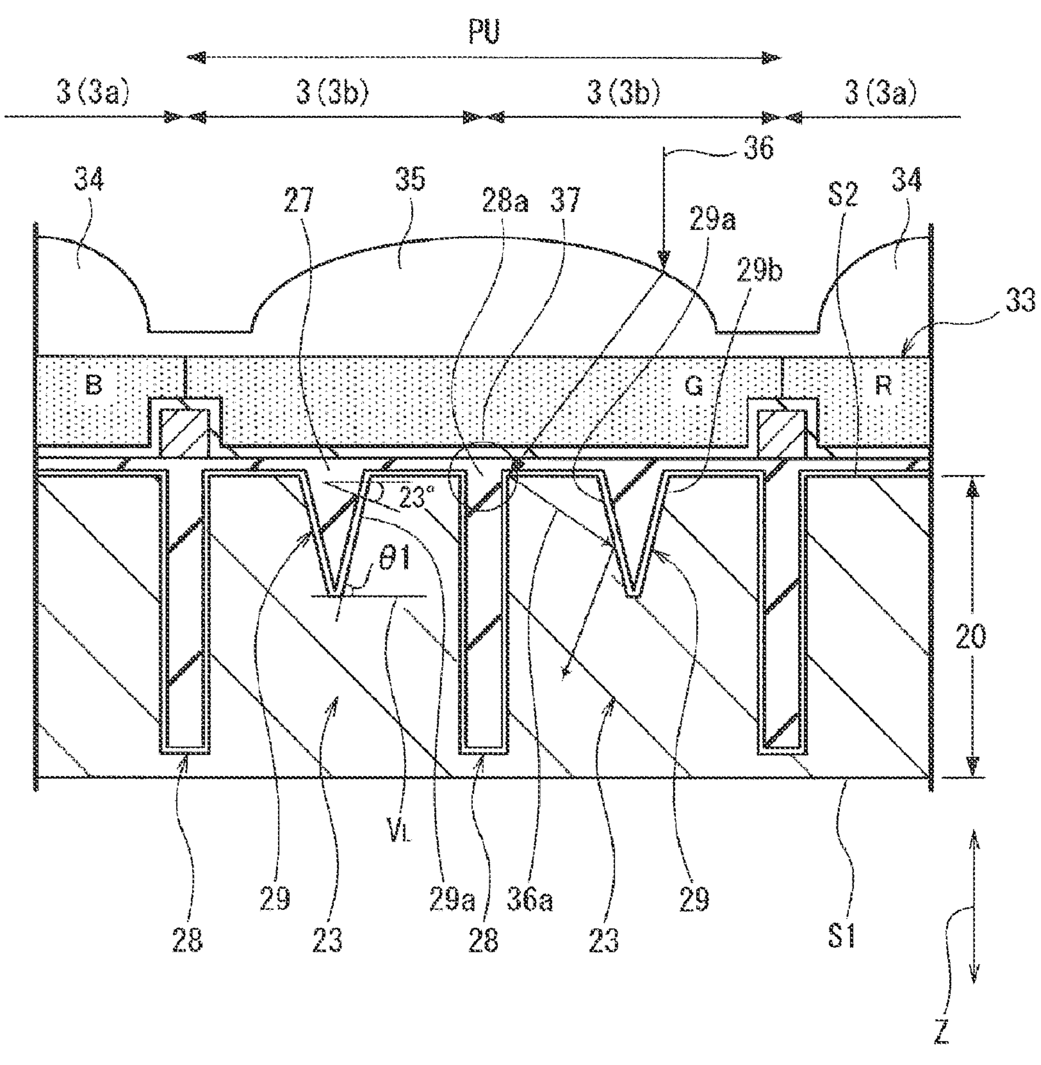
FIG. 4B is a view illustrating a reflection state of incident light.

Next, main advantageous effects of the first embodiment will be described. FIG. 4B is a view illustrating a reflection state of incident light. Table 1 shows values obtained by calculating the critical angles at the Si—SiO2 interface in visible light from Snell's law with a maximum wavelength of the visible light as 700 nm.

TABLE 1

| Wavelength (nm) | Critical angle (iO) | Refractive index of Si (n) | Refractive index of $SiO_2$ (n) |
|---|---|---|---|
| 700 | 22.95 | 3.78 | 1.46 |
| 670 | 22.43 | 3.82 | 1.46 |
| 530 | 20.56 | 4.16 | 1.46 |
| 460 | 18.63 | 4.58 | 1.46 |
| 400 | 15.29 | 5.57 | 1.47 |

As illustrated in FIG. 4B, in the pixel unit PU in which one shared on-chip lens 35 is shared by four photoelectric conversion sections 23 in 2×2 arrangement, the condensing point 37 of the shared on-chip lens 35 is positioned at the intersection portion 28*a* of the isolation region 28. Therefore, the incident light 36 condensed at the condensing point 37 of the shared on-chip lens 35 is scattered due to a refractive index difference between silicon (n=3.9) of the photoelectric conversion section 23 and silicon oxide (n=1.4) of the isolation region 28 at the condensing point 37. Then, a scattered light 36*a* hits the inclined surface 29*a* of the light reflector 29. In this case, one side is the silicon of the photoelectric conversion section 23 and the other side is the silicon oxide of the light reflector 29 with the inclined surface 29*a* interposed therebetween. Additionally, the inclined surface 29*a* is inclined at the inclination angle θ1=67°. Accordingly, even if the scattered light 36*a* is parallel to the direction (virtual line VL) orthogonal to the thickness direction (Z direction) of the semiconductor layer 20, in other words, parallel to the light incident surface (second surface S2) of the semiconductor layer 20, an incident angle at which the scattered light 36*a* is incident on the inclined surface 29*a* of the light reflector 29 is 23° or more, and exceeds the critical angle 23° (22.95°) of a wavelength 700 nm shown in Table 1, so that the visible light is totally reflected. Accordingly, the inclination angle θ1 of the inclined surface 29*a* of the light reflector 29 satisfies Formula (1) described above. Therefore, it is possible to cause the scattered light 36*a* scattered at the condensing point 37 to be reflected by the inclined surface 29*a* of the light reflector 29 toward the first surface S1 side of the semiconductor layer 20 to change the optical path. Therefore, it is possible to prevent the scattered light 36*a* scattered at the condensing point 37, as unnecessary light, from entering the photoelectric conversion sections 23 of the pixels 3*a* of different colors adjacent to the four photoelectric conversion sections 23 that share one shared on-chip lens 35, so that color mixing between the pixels 3 of different colors can be suppressed.

Both ends of the light reflecting portion 29 in the first embodiment are connected to the isolation region 28. Therefore, also on the isolation region side, it is possible to cause the scattered light 36*a* scattered at the condensing point 37 to be reflected by the inclined surface 29*a* of the light reflector 29 toward the first surface S1 side of the semiconductor layer 20 to change the optical path. Accordingly, color mixing between the pixels 3 of different colors can be efficiently suppressed.

Note that, although the critical angle of the Si—$SiO_2$ interface has been described in the first embodiment, by satisfying Formula (1) described above, similar advantageous effects can be obtained even in a combination of other materials at the interface of the inclined surface 29*a*.

Second Embodiment

A solid-state imaging device 1B according to a second embodiment of the present technology basically has a similar configuration as the solid-state imaging device 1A according to the first embodiment described above, but has a different configuration of a light reflector.

That is, as illustrated in FIG. 3C, the light reflector 29 of the solid-state imaging device 1A according to the first embodiment is separated from the condensing point 37 and in contact with the isolation region 28.

Figure 6:
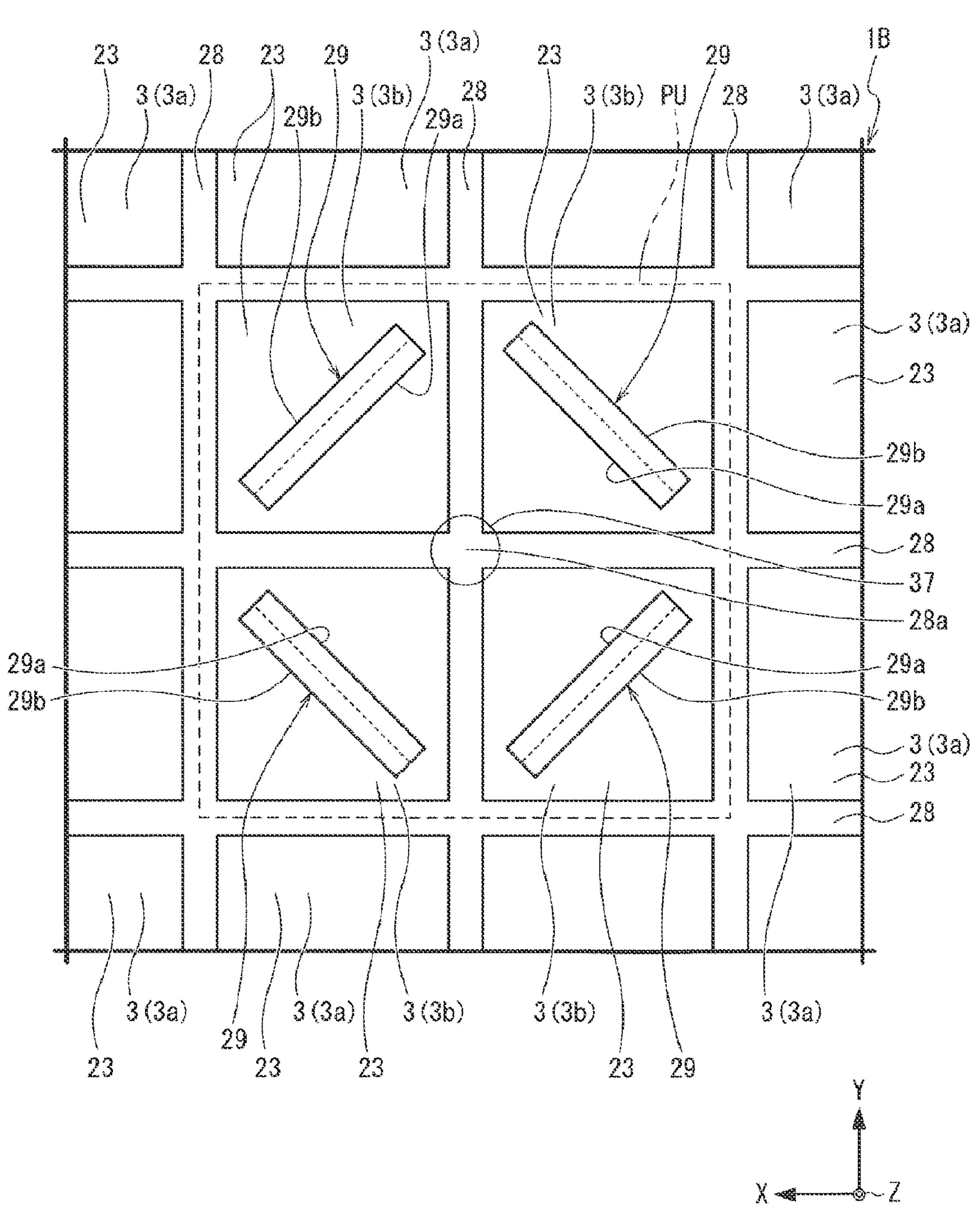
FIG. 6 is a schematic plan view illustrating a configuration example of a solid-state imaging device according to a second embodiment of the present technology.

On the other hand, as illustrated in FIG. 6, the light reflector 29 of the solid-state imaging device 1B according to the second embodiment is separated from the condensing point 37 and the isolation region 28. Other configurations are similar to those in the second embodiment described above.

According to the solid-state imaging device 1B of the second embodiment, advantageous effects similar to those of the solid-state imaging device 1A according to the first embodiment described above can be obtained.

Furthermore, according to the solid-state imaging device 1B of the second embodiment, the light reflector 29 has a configuration in which the light reflector 29 is separated from the condensing point 37 and the isolation region 28, so that the reflection groove portion 25 (see FIG. 5F) can be easily formed in the manufacturing process. Accordingly, the solid-state imaging device 1B with a high yield can be provided.

Third Embodiment

Figure 7:
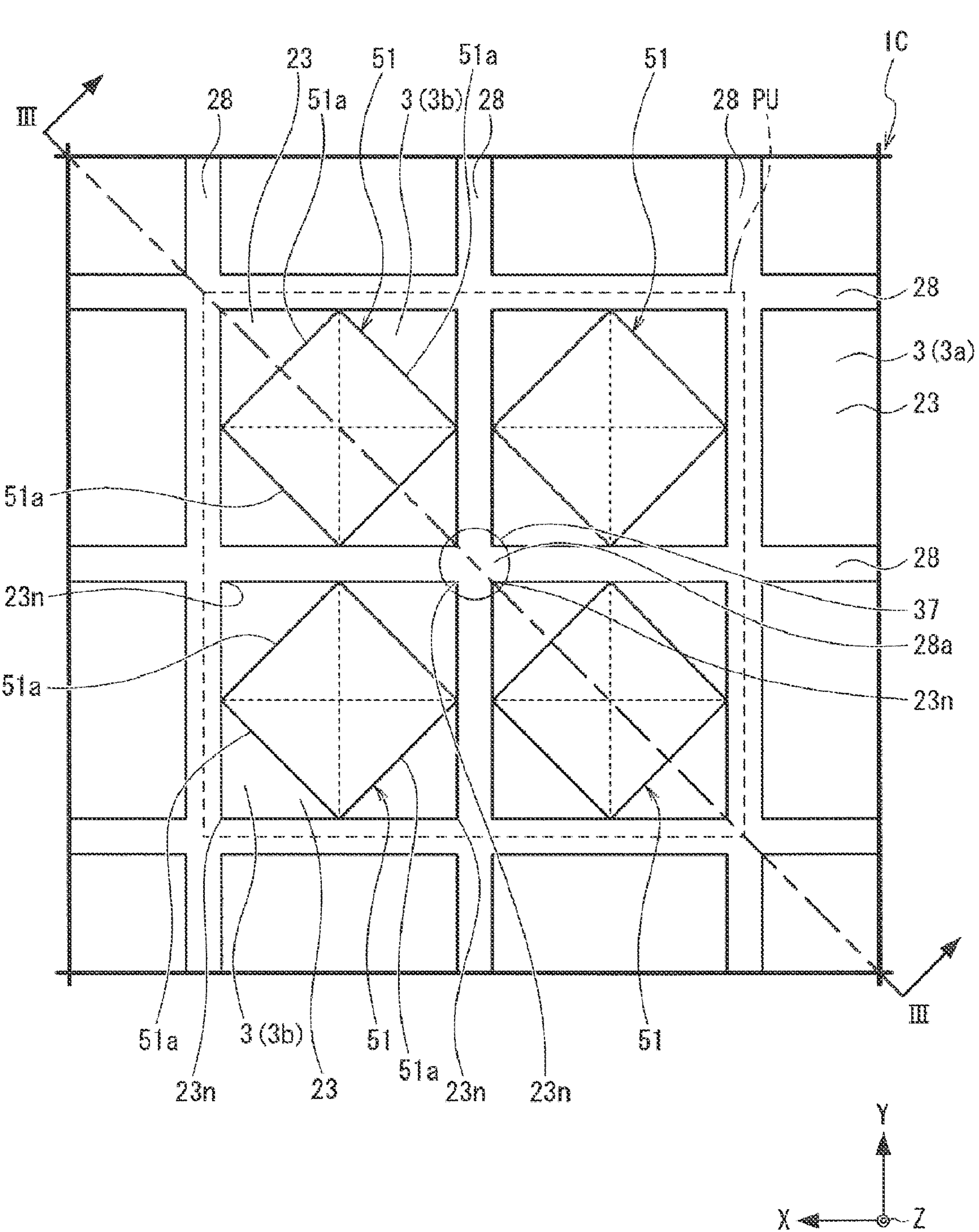
FIG. 7 is a schematic plan view illustrating a configuration example of a solid-state imaging device according to a third embodiment of the present technology.

FIG. 7 is a schematic plan view illustrating a configuration example of a solid-state imaging device according to a third embodiment of the present technology. FIG. 8 is a schematic cross-sectional view illustrating a cross-sectional structure taken along line III-III in FIG. 7B. FIG. 8B is a view illustrating a reflection state of incident light. Note that, in FIG. 7, illustration of on-chip lenses and a shared on-chip lens is omitted in order to make the drawing easy to see.

A solid-state imaging device 1C according to the third embodiment of the present technology basically has a similar configuration as the solid-state imaging device 1A according to the first embodiment described above, but has a different configuration of a light reflector.

Figure 8A:
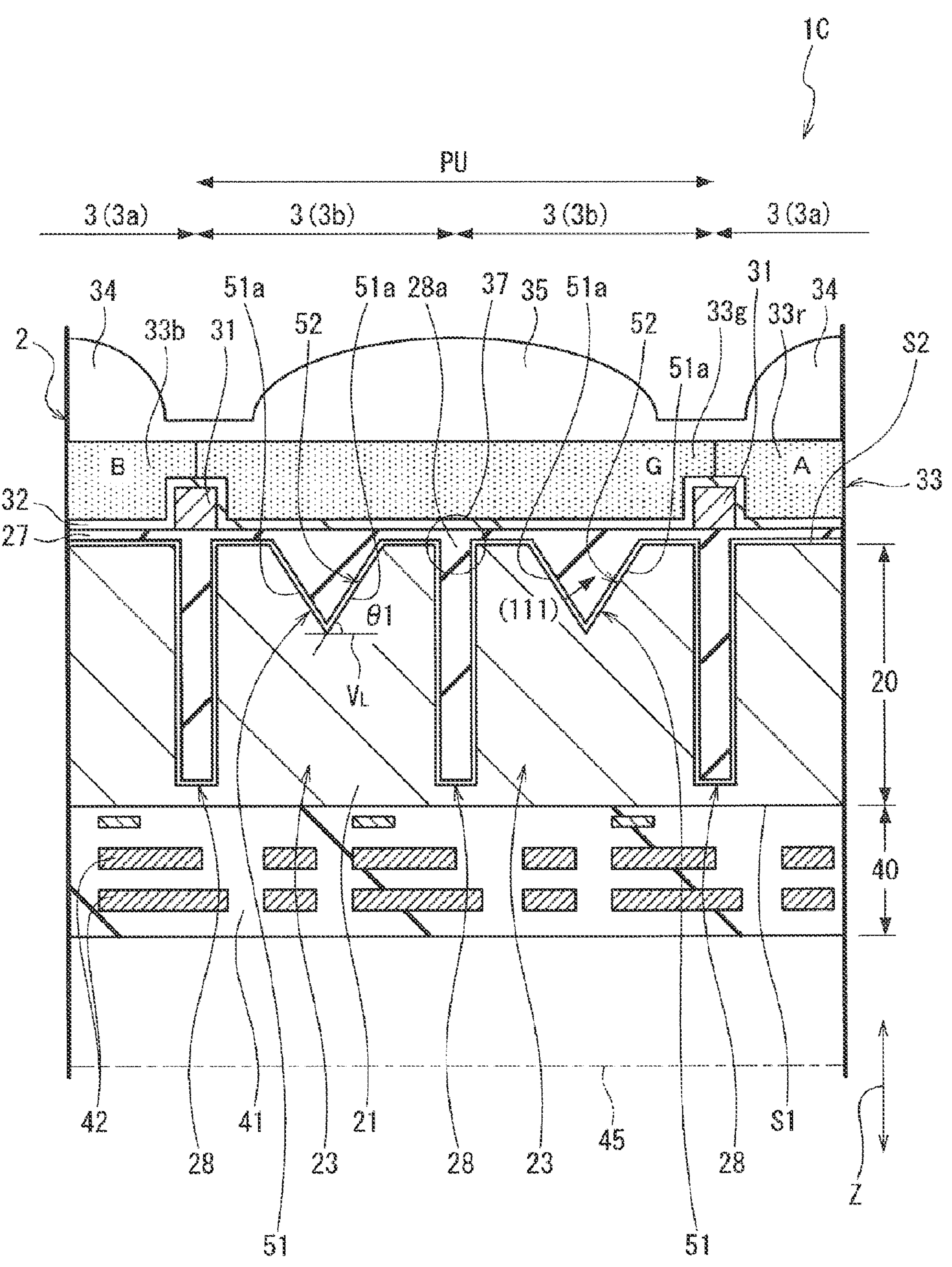
FIG. 8A is a schematic cross-sectional view illustrating a cross-sectional structure taken along line III-III in FIG. 7B.
Figure 8B:
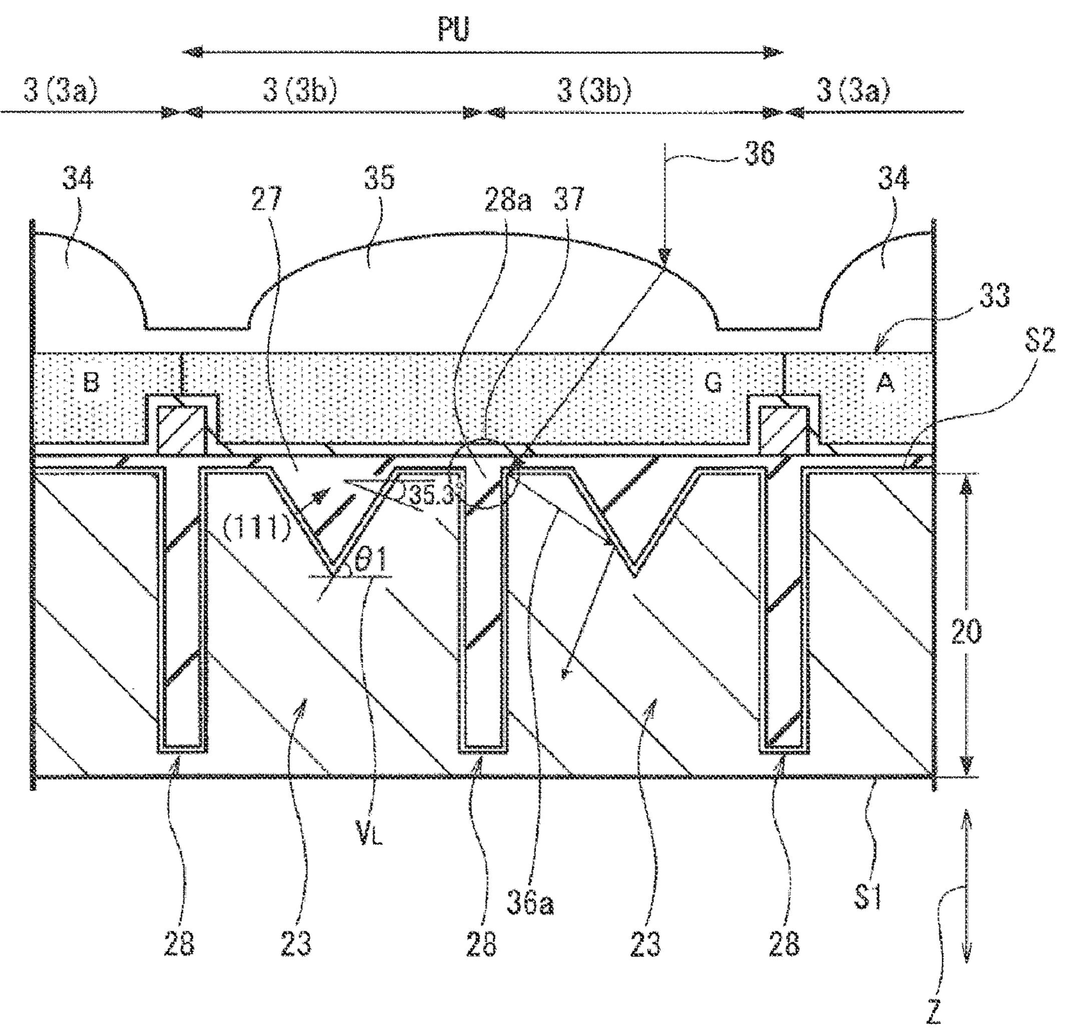
FIG. 8B is a view illustrating a reflection state of incident light.

That is, as illustrated in FIGS. 7 and 8A, the solid-state imaging device 1C according to the third embodiment includes light reflectors 51 instead of the light reflectors 29 illustrated in FIG. 4A. Other configurations are similar to those in the first embodiment described above, and thus repeated description will be omitted.

As illustrated in FIGS. 7 and 8A, each of the four photoelectric conversion sections 23 that share one shared on-chip lens 35 includes the light reflector 51 that causes the scattered light 36*a* (see FIG. 8B) obtained by scattering the incident light 36 condensed at the condensing point 37 of the shared on-chip lens 35 due to a refractive index difference between the photoelectric conversion section 23 and the isolation region 28 at the condensing point 37 to be reflected toward the first surface S1 side of the semiconductor layer 20.

The light reflector 51 has an embedded structure in which the insulating film 27 is embedded in a reflection groove portion 52 extending from the second surface S2 side toward the first surface S1 side of the semiconductor layer 20 with the functional layer 26 interposed therebetween. Furthermore, the light reflector 51 has a quadrangular pyramid shape in which the width thereof gradually decreases from the second surface S2 side toward the first surface S1 side of the semiconductor layer 20. That is, the light reflector 51 has four inclined surfaces 51*a*.

As illustrated in FIGS. 7 and 8A, the light reflector 51 is arranged such that the four inclined surfaces 51*a* individually face the corresponding four corner portions 23*n*, respectively, of the photoelectric conversion section 23 in a plan view. That is, among the four inclined surfaces 51*a*, one inclined surface 51*a* faces the intersection portion 28*a* of the isolation region 28 and the condensing point 37 of the shared on-chip lens 35 in a plan view. Furthermore, similarly to the light reflector 51 in the first embodiment described above, the light reflector 51 has a depth from the second surface S2 side toward the first surface S1 side of the semiconductor layer 20 shallower than the depth of the isolation region 28, that is, the depth from the second surface S2 side of the semiconductor layer 20 is shallower than that of the isolation region 28.

The four inclined surfaces 51*a* each incline at the same angle, and in describing the inclined surface 51*a* positioned on the condensing point 37 side among the four inclined surfaces 51*a* as a representative, the inclined surface 51*a* is inclined at an angle at which the inclination angle θ1 on an inner angle side formed by the inclined surface 51*a* and the virtual line $V_L$ orthogonal to the thickness direction (Z direction) of the semiconductor layer 20 is an obtuse angle. Additionally, when the refractive index of the photoelectric conversion section 23 is n1 and the refractive index of the light reflector 51 is n2, the inclination angle θ1 satisfies Formula (1) described above.

In the third embodiment, the inclined surface 51*a* has a (111) crystal plane of silicon. Accordingly, the light reflector 51 in the third embodiment has the inclined surface 51*a* inclined at an inclination angle θ1=54.7°.

In the third embodiment, the inclined surface 51*a*, of the light reflector 51, positioned on the condensing point 37 side is inclined at the inclination angle θ1=54.7°. Accordingly, as illustrated in FIG. 8B, even if the scattered light 36*a* is parallel to the direction (virtual line VL) orthogonal to the thickness direction (Z direction) of the semiconductor layer 20, in other words, parallel to the light incident surface (second surface S2) of the semiconductor layer 20, the incident angle at which the scattered light 36*a* is incident on the inclined surface 29*a* of the light reflector 29 is 35.3°, and greatly exceeds the critical angle 23° (22.95°) of the wavelength 700 nm shown in Table 1 described above, so that the visible light is totally reflected. Accordingly, the inclination angle θ1 of the inclined surface 51*a* of the light reflector 51 satisfies Formula (1) described above. Therefore, it is possible to cause the scattered light 36*a* scattered at the condensing point 37 to be reflected by the inclined surface 51*a* of the light reflector 51 toward the first surface S1 side of the semiconductor layer 20 to change the optical path. Therefore, similarly to the first embodiment described above, it is possible to prevent the scattered light 36*a* scattered at the condensing point 37, as unnecessary light, from entering the photoelectric conversion sections 23 of the pixels 3*a* of different colors adjacent to the four photoelectric conversion sections 23 that share one shared on-chip lens 35, so that color mixing between the pixels 3 of different colors can be suppressed.

The inclined surface 51*a* of the light reflector 51 can be easily formed by, for example, wet etching the semiconductor layer 20 under the etching condition based on the (111) crystal plane of silicon in the process of manufacturing the solid-state imaging device 1C.

Note that, similarly to the light reflector 29 illustrated in FIG. 3C in the first embodiment described above, the light reflector 51 in the third embodiment may have a configuration in which the light reflector 51 is separated from the condensing point 37 and in contact with the isolation region 28, furthermore, similarly to the light reflector 29 illustrated in FIG. 6 in the second embodiment described above, the light reflector 51 may have a configuration in which the light reflector 51 is separated from the condensing point 37 and the isolation region 28.

Fourth Embodiment

A solid-state imaging device 1D according to a fourth embodiment of the present technology basically has a similar configuration as the solid-state imaging device 1C according to the third embodiment described above, but has a different configuration of a light reflecting portion.

Figure 9:
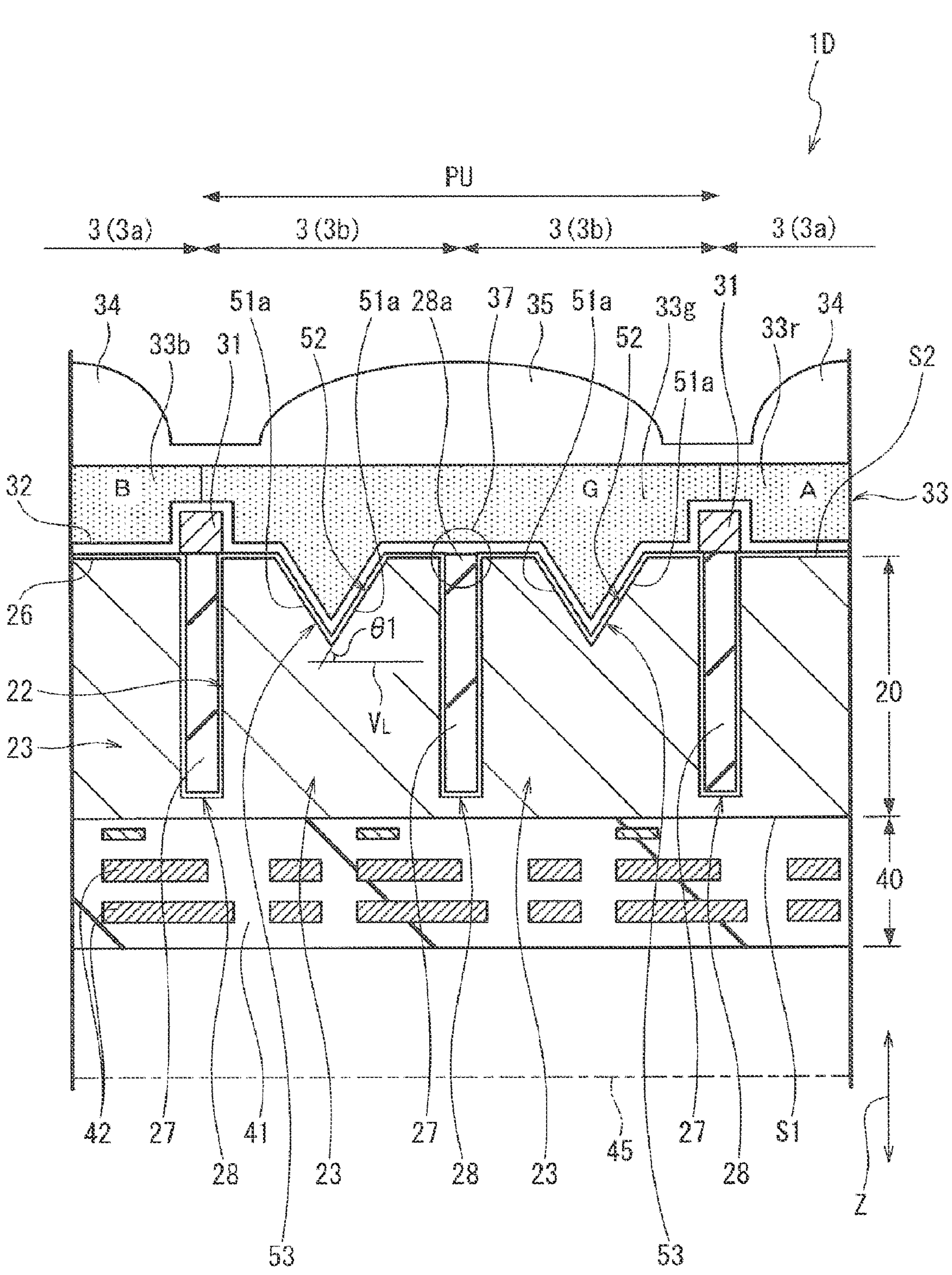
FIG. 9 is a schematic cross-sectional view illustrating a configuration example of a solid-state imaging device according to a fourth embodiment of the present technology.

That is, as illustrated in FIG. 9, the photoelectric conversion sections 23 in the fourth embodiment includes light reflectors 53 instead of the light reflectors 51 illustrated in FIG. 8A. Other configurations are similar to those in the first embodiment described above.

The light reflector 53 basically has a similar configuration as the light reflector 51 in the third embodiment described above, but the material embedded in the reflection groove portion 52 is different. The light reflector 51 in the third embodiment described above has an embedded structure in which the insulating film 27 is embedded in the reflection groove portion 52 extending from the second surface S2 side toward the first surface S1 side of the semiconductor layer 20 with the functional layer 26 interposed therebetween. On the other hand, the light reflector 53 in the fourth embodiment has an embedded structure in which a portion of the second color filter portion 33*g* of the color filter layer 33 is embedded in the reflection groove portion 52 with the functional layer 26 and the adhesive film 32 interposed therebetween. The refractive index of the second color filter portion 33*g* is approximately 1.6 to 1.8 in the case of a wavelength of 530 nm, for example.

Accordingly, also in the light reflector 53 in the fourth embodiment, the inclination angle θ1 of the inclined surface 51*a* satisfies Formula (1) described above. Therefore, it is possible to cause the scattered light 36*a* scattered at the condensing point 37 to be reflected by the inclined surface 51*a* of the light reflector 51 toward the first surface S1 side of the semiconductor layer 20 to change the optical path. Therefore, similarly to the first embodiment described above, it is possible to prevent the scattered light 36*a* scattered at the condensing point 37, as unnecessary light, from entering the photoelectric conversion sections 23 of the pixels 3*a* of different colors adjacent to the four photoelectric conversion sections 23 that share one shared on-chip lens 35, so that color mixing between the pixels 3 of different colors can be suppressed.

Note that, similarly to the light reflector 29 illustrated in FIG. 3C in the first embodiment described above, the light reflector 53 in the fourth embodiment may have a configuration in which the light reflector 53 is separated from the condensing point 37 and in contact with the isolation region 28, furthermore, similarly to the light reflector 29 illustrated in FIG. 6 in the second embodiment described above, the light reflector 53 may have a configuration in which the light reflector 53 is separated from the condensing point 37 and the isolation region 28.

Fifth Embodiment

A solid-state imaging device 1E according to a fifth embodiment of the present technology basically has a similar configuration as the solid-state imaging device 1A according to the first embodiment described above, but has a different configuration of a light reflector.

Figure 10:
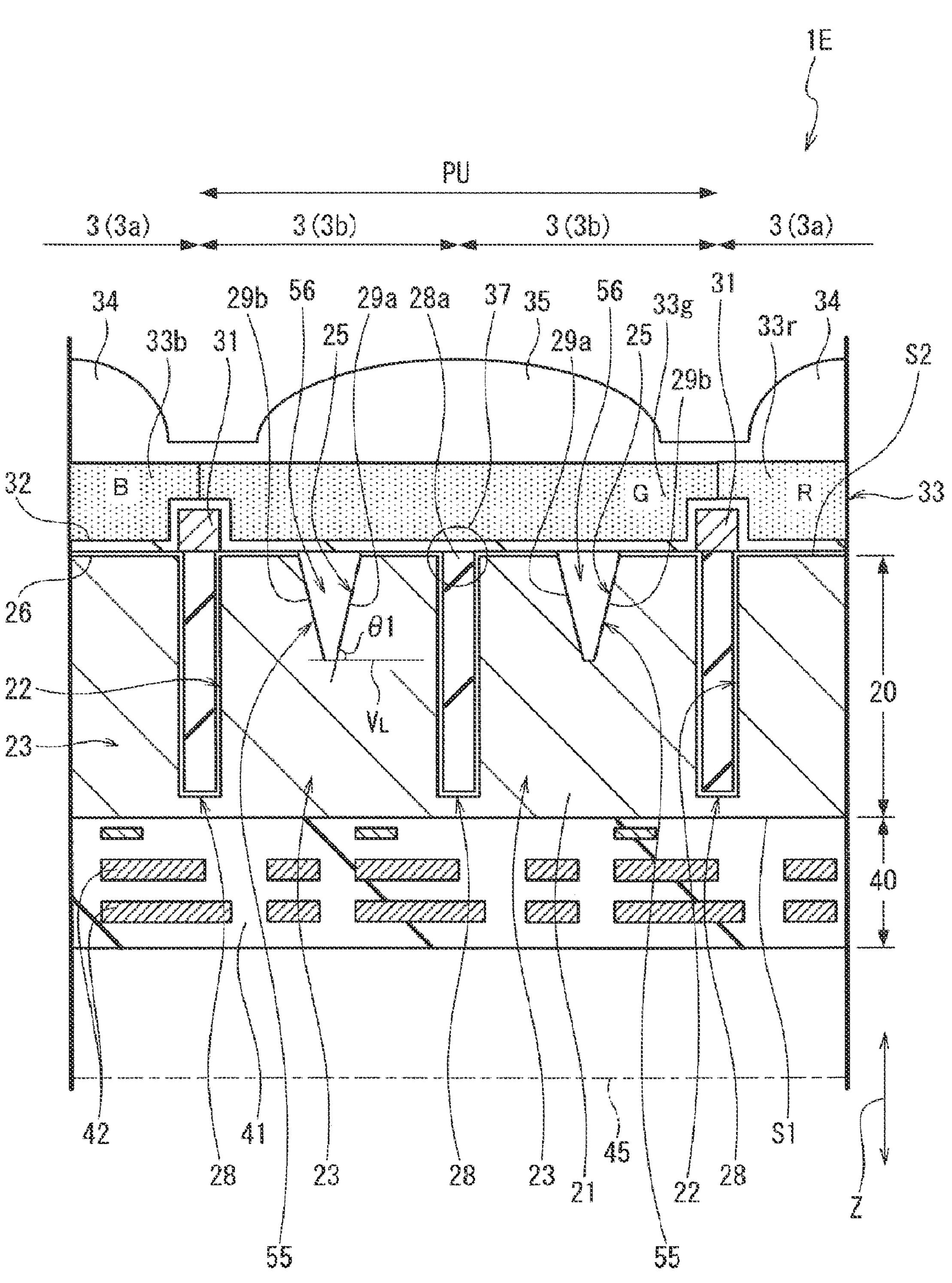
FIG. 10 is a schematic cross-sectional view illustrating a configuration example of a solid-state imaging device according to a fifth embodiment of the present technology.

That is, as illustrated in FIG. 10, the solid-state imaging device 1D according to the fifth embodiment includes light reflectors 55 instead of the light reflectors 29 illustrated in FIG. 4A. Other configurations are similar to those in the first embodiment described above, and thus repeated description will be omitted.

As illustrated in FIG. 10, the light reflector 55 has a structure in which a hollow portion 56 is provided in the reflection groove portion 25 extending from the second surface S2 side toward the first surface S1 side of the semiconductor layer 20. Furthermore, the light reflector 55 has a wedge shape in which the width thereof gradually decreases from the second surface S2 side toward the first surface S1 side of the semiconductor layer 20. Furthermore, the light reflector 55 extends along a diagonal on which the condensing point 37 of the shared on-chip lens 35 is not positioned out of two diagonals of the photoelectric conversion section 23 in a plan view, and both ends thereof are connected to the isolation region 28. That is, the light reflector 55 is separated from the condensing point 37 and in contact with the isolation region 28. Furthermore, similarly to the light reflector 51 in the first embodiment described above, the light reflector 55 has a depth from the second surface S2 side toward the first surface S1 side of the semiconductor layer 20 shallower than the depth of the isolation region 28, that is, the depth from the second surface S2 side of the semiconductor layer 20 is shallower than that of the isolation region 28.

Furthermore, the light reflector 55 has the inclined surface 29*a* that is positioned on a side facing the condensing point 37 in a plan view, that is, the condensing point 37 side, and is inclined such that the inclination angle θ1 on an inner angle side formed by the inclined surface 29*a* and the virtual line $V_L$ orthogonal to the thickness direction (Z direction) of the semiconductor layer 20 is an acute angle.

Additionally, when the refractive index of the photoelectric conversion section 23 is n1 and the refractive index of the light reflector 55 is n2, the inclination angle θ1 satisfies Formula (1) described above.

The hollow portion 56 of the light reflector 55 is, with respect to the inside thereof, filled with inert gas or is in a vacuum state, and has a refractive index lower than that of silicon oxide. Accordingly, also in the fifth embodiment, advantageous effects similar to those obtained in the first embodiment described above can be obtained.

Note that, by forming the reflection groove portion after the insulating film is embedded in the isolation groove portion, a material having a refractive index lower than that of the silicon oxide film can be embedded in the reflection groove portion.

Note that, similarly to the light reflector 29 illustrated in FIG. 3C in the first embodiment described above, the light reflector 55 in the fifth embodiment may have a configuration in which the light reflector 55 is separated from the condensing point 37 and in contact with the isolation region 28, furthermore, similarly to the light reflector 29 illustrated in FIG. 6 in the second embodiment described above, the light reflector 55 may have a configuration in which the light reflector 55 is separated from the condensing point 37 and the isolation region 28.

Sixth Embodiment

<<Application Example to Electronic Device>>

The present technology (technology according to the present disclosure) can be applied to various types of electronic devices such as an imaging device such as, for example, a digital still camera or a digital video camera, a mobile phone having an imaging function, or another device having an imaging function.

FIG. 11 is a view illustrating a schematic configuration of an electronic device (for example, a camera) according to a sixth embodiment of the present technology.

As illustrated in FIG. 11, an electronic device 100 includes a solid-state imaging device 101, the optical lens 102, a shutter device 103, a drive circuit 104, and a signal processing circuit 105. In the electronic device 100, the solid-state imaging devices 1A, 1B, 1C, 1D, and 1E according to the first to fifth embodiments of the present technology are used as the solid-state imaging device 101.

The optical lens 102 forms an image of image light (incident light 106) from a subject on an imaging surface of the solid-state imaging device 101. Therefore, a signal charge is accumulated in the solid-state imaging device 101 over a certain period. The shutter device 103 controls a light irradiation period and a light shielding period for the solid-state imaging device 101. The drive circuit 104 supplies a drive signal for controlling a transfer operation of the solid-state imaging device 101 and a shutter operation of the shutter device 103. Signal transfer of the solid-state imaging device 101 is performed by the drive signal (timing signal) supplied from the drive circuit 104. The signal processing circuit 105 performs various types of signal processing on a signal (pixel signal) output from the solid-state imaging device 101. A video signal subjected to signal processing is stored in a storage medium such as a memory or output to a monitor.

With such a configuration, the electronic device 100 in the sixth embodiment can suppress color mixing between the pixels of different colors in the solid-state imaging device 101. Accordingly, it is possible to improve image quality.

Note that the electronic device 100 to which the above-described solid-state imaging devices 1A to 1E can be applied is not limited to a camera, but can also be applied to other electronic devices. For example, the solid-state imaging devices 1A to 1E may be applied to an imaging device such as a camera module for mobile devices such as mobile phones and tablet terminals.

Note that the present technology may have the following configurations.

(1)

A solid-state imaging device, including:

a semiconductor layer including a plurality of photoelectric conversion sections partitioned by an isolation region;

a shared on-chip lens arranged on a light incident surface side of the semiconductor layer, the shared on-chip lens being shared by the photoelectric conversion sections adjacent to each other with the isolation region interposed between the photoelectric conversion sections, and having a condensing point positioned in the isolation region; and a concave portion provided in an upper portion of the photoelectric conversion sections that share the shared on-chip lens on the light incident surface of the semiconductor layer.

(2)

The solid-state imaging device according to (1) described above, in which the concave portion is a light reflector that causes light obtained by scattering incident light condensed at the condensing point of the shared on-chip lens at the condensing point to be reflected toward a side opposite to the light incident surface of the semiconductor layer.

(3)

The solid-state imaging device according to (2) described above, in which the light reflector has an inclined surface that is positioned on a condensing point side in a plan view, and is inclined such that an inclination angle formed by the inclined surface and a virtual line orthogonal to a thickness direction of the semiconductor layer is an acute angle.

(4)

The solid-state imaging device according to (3) described above, in which when the inclination angle is θ1, a refractive index of the photoelectric conversion sections is n1, and a refractive index of the light reflector is n2, $\theta 1 \leq \theta = 90 - \arcsin(n2/n1)$ is satisfied.

(5)

The solid-state imaging device according to any one of (2) to (4) described above, in which the light reflector is separated from the condensing point and in contact with the isolation region.

(6)

The solid-state imaging device according to any one of (2) to (4) described above, in which the light reflector is separated from the condensing point and the isolation region.

(7)

The solid-state imaging device according to any one of (2) to (6) described above, in which the light reflector has a (111) plane.

(8)

The solid-state imaging device according to (7) described above, in which the light reflector is a quadrangular pyramid.

(9)

The solid-state imaging device according to any one of (2) to (8) described above, in which the shared on-chip lens is arranged on a side of the semiconductor layer with a color filter interposed between the shared on-chip lens and the semiconductor layer, and the light reflector includes a groove portion provided in the photoelectric conversion sections and a portion of the color filter embedded in the groove portion.

(10)

The solid-state imaging device according to any one of (2) to (8) described above, in which the light reflector includes a groove portion provided in the photoelectric conversion sections and a hollow portion provided in the groove portion.

(11)

The solid-state imaging device according to (2) to (11) described above, in which the light reflector has a depth from the light incident surface side of the semiconductor layer shallower than a depth of the isolation region.

(12)

An electronic device, including:

a solid-state imaging device;

an optical lens that forms an image of image light from a subject on an imaging surface of the solid-state imaging device; and a signal processing circuit that performs signal processing on a signal output from the solid-state imaging device, in which the solid-state imaging device includes:

a semiconductor layer including a plurality of photoelectric conversion sections partitioned by an isolation region;

a shared on-chip lens that is shared by the photoelectric conversion sections adjacent to each other with the isolation region interposed between the photoelectric conversion sections, the shared on-chip lens being provided on a light incident surface side of the semiconductor layer so as to have a condensing point positioned in the isolation region; and a light reflector provided in the photoelectric conversion sections that share the shared on-chip lens, the light reflector causing light condensed at the condensing point and scattered in the isolation region to be reflected toward a side opposite to the light incident surface of the semiconductor layer.

The scope of the present technology is not limited to the exemplary embodiments illustrated and described, but also includes all embodiments that provide equivalent advantageous effects to those at which the present technology is aimed. Moreover, the scope of the present technology is not limited to combination of characteristics of the invention defined in claims, but is defined in accordance with any desired combination of specific characteristics from all the disclosed respective characteristics.

REFERENCE SIGNS LIST

1A, 1B, 1C, 1D, 1E Solid-state imaging device
2 Semiconductor chip
2A Pixel array section
2B Peripheral section
2C Pad arrangement section
3 Pixel
4 Vertical drive circuit
5 Column signal processing circuit
6 Horizontal drive circuit
7 Output circuit
8 Control circuit
10 Pixel drive wiring line
11 Vertical signal line
12 Horizontal signal line
13 Electrode pad
20 Semiconductor layer
21 n-type well region
22 Isolation groove portion
23 Photoelectric conversion section
24 Etching mask
25 Reflection groove portion
26 Functional layer
27 Insulating film
28 Isolation region
28*a* Intersection portion
29 Light reflector
29*a* Inclined surface
31 Light shielding film
32 Adhesive film
33 Color filter layer
34 On-chip lens
35 Shared on-chip lens
36 Incident light
37 Condensing point
40 Multilayer wiring layer
41 Interlayer insulating film
42 Wiring line
45 Support substrate

What is claimed is:

1. A solid-state imaging device, comprising:

a semiconductor layer including a plurality of photoelectric conversion sections partitioned by an isolation region;

a shared on-chip lens arranged above a light incident surface of the semiconductor layer, the shared on-chip lens being shared by the photoelectric conversion sections adjacent to each other with the isolation region interposed between the photoelectric conversion sections, and having a condensing point positioned in the isolation region; and a concave portion provided in an upper portion of the photoelectric conversion sections that share the shared on-chip lens on the light incident surface of the semiconductor layer, wherein the concave portion is a light reflector that causes light obtained by scattering incident light condensed at the condensing point of the shared on-chip lens at the condensing point to be reflected toward a side opposite to the light incident surface of the semiconductor layer, and wherein the light reflector is separated from the condensing point and in contact with the isolation region.

2. The solid-state imaging device according to claim 1, wherein the light reflector has an inclined surface that is positioned on a condensing point side in a plan view, and is inclined such that an inclination angle formed by the inclined surface and a virtual line orthogonal to a thickness direction of the semiconductor layer is an acute angle.

3. The solid-state imaging device according to claim 2, wherein when the inclination angle is θ1, a refractive index of the photoelectric conversion sections is n1, and a refractive index of the light reflector is n2, $\theta 1 \leq \theta = 90 - \arcsin(n2/n1)$ is satisfied.

4. The solid-state imaging device according to claim 1, wherein the light reflector has a (111) plane.

5. The solid-state imaging device according to claim 4, wherein the light reflector is a quadrangular pyramid.

6. The solid-state imaging device according to claim 1, wherein the shared on-chip lens is arranged on a side of the semiconductor layer with a color filter interposed between the shared on-chip lens and the semiconductor layer, and the light reflector includes a groove portion provided in the photoelectric conversion sections and a portion of the color filter embedded in the groove portion.

7. The solid-state imaging device according to claim 1, wherein the light reflector includes a groove portion provided in the photoelectric conversion sections and a hollow portion provided in the groove portion.

8. The solid-state imaging device according to claim 1, wherein the light reflector has a depth from the light incident surface side of the semiconductor layer shallower than a depth of the isolation region.

* * * * *